(12) United States Patent
Kawashima

(10) Patent No.: US 7,786,636 B2
(45) Date of Patent: Aug. 31, 2010

(54) MAGNETIC BEARING DEVICE AND A TURBO MOLECULAR PUMP WITH THE MAGNETIC BEARING DEVICE MOUNTED THERETO

(75) Inventor: Toshiaki Kawashima, Chiba (JP)

(73) Assignee: BOC Edwards Japan Limited (JP)

( * ) Notice: Subject to any disclaimer, the term of this patent is extended or adjusted under 35 U.S.C. 154(b) by 924 days.

(21) Appl. No.: 10/591,626

(22) PCT Filed: Feb. 28, 2005

(86) PCT No.: PCT/JP2005/003347
§ 371 (c)(1),
(2), (4) Date: Sep. 5, 2006

(87) PCT Pub. No.: WO2005/085663
PCT Pub. Date: Sep. 15, 2005

(65) Prior Publication Data
US 2007/0188966 A1 Aug. 16, 2007

(30) Foreign Application Priority Data
Mar. 4, 2004 (JP) ............................ 2004-060047

(51) Int. Cl.
*H02K 7/09* (2006.01)
*F16C 39/00* (2006.01)

(52) U.S. Cl. .................. 310/90.5; 310/68 R; 310/68 B; 310/68 D; 361/144

(58) Field of Classification Search ............... 310/90.5, 310/68 R, 68 B, 68 D; 361/144
See application file for complete search history.

(56) References Cited

U.S. PATENT DOCUMENTS 3,937,533 A * 2/1976 Veillette .................... 310/90.5

(Continued)

FOREIGN PATENT DOCUMENTS

EP 0836022 4/1998

(Continued)

OTHER PUBLICATIONS

Schroeder U:; "Power Amplifiers for Magnetic Bearings" Proceedings of Magnetic Bearings, Magnetic Drives and Dry Gasseals Conference and Exhibition, XX, XX, Aug. 11, 1995, pp. 285-301, XP008041072 * p. 291-p. 297; figures 5-10 *.

*Primary Examiner*—Quyen Leung
*Assistant Examiner*—David W. Scheuermann
(74) *Attorney, Agent, or Firm*—Adams & Wilks

(57) ABSTRACT

A magnetic bearing device has a rotor, electromagnets that control axial/radial positions of the rotor, and a power source that supplies power to the electromagnets. A switching circuit switches a voltage of a common node connected to each one end of the electromagnets. The switching circuit includes a first switch element that connects and disconnects between one end of the power source and the common node, and a first rectifier element connected between the other end of the power source and the common node. An excitation control circuit controls excitation of each of the electromagnets by a supply current that flows through the electromagnets in one direction or a regenerated current that flows through the electromagnets in one direction. The excitation control circuit includes a second switch element that connects and disconnects between the other end of one of the electromagnets and the other end of the power source, and a second rectifier element connected between the other end of one of the electromagnets and the one end of the power source.

17 Claims, 12 Drawing Sheets

U.S. PATENT DOCUMENTS 5,227,948 A * 7/1993 Boon et al. ............ 361/144
6,005,316 A    12/1999 Harris ................. 310/90.5
6,644,938 B2 * 11/2003 Omori ................. 417/353

FOREIGN PATENT DOCUMENTS

EP    1318310    6/2003
EP    1460294    9/2004

* cited by examiner

FIG. 12
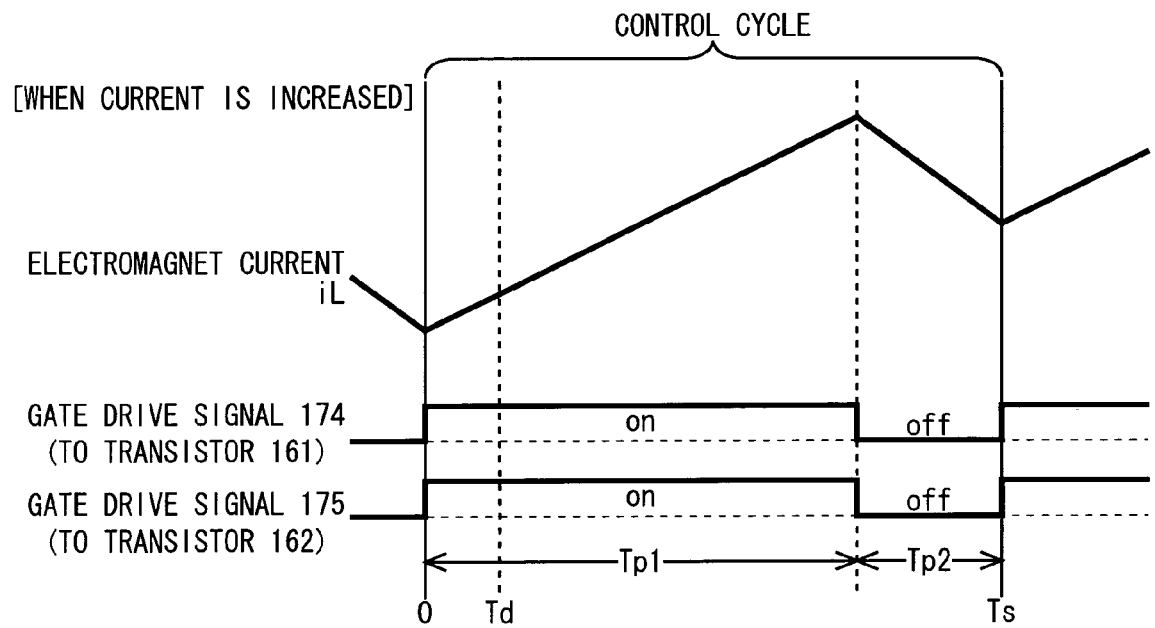
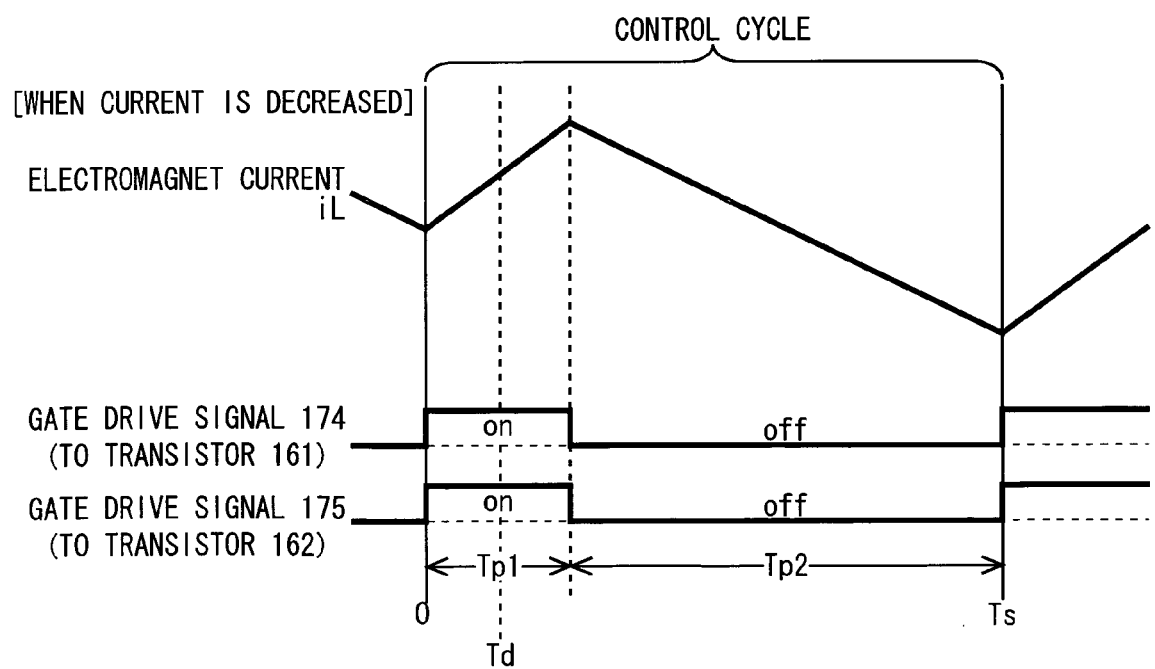

MAGNETIC BEARING DEVICE AND A TURBO MOLECULAR PUMP WITH THE MAGNETIC BEARING DEVICE MOUNTED THERETO

CROSS-REFERENCE TO RELATED APPLICATIONS

This application is a U.S. national stage application of copending International Application No. PCT/JP2005/003347, filed Feb. 28, 2005, claiming a priority date of Mar. 4, 2004, and published in the non-English language.

TECHNICAL FIELD

The present invention relates to a magnetic bearing device and a turbo molecular pump with the magnetic bearing device mounted thereto. More specifically, the present invention relates to a magnetic bearing device capable of reducing the costs required for the manufacture, installation, or the like of a turbo molecular pump by reducing the number of elements of an amplifier circuit that drives electromagnets through excitation, and of reducing an error at the time of detecting a current flowing through the electromagnets, and to a turbo molecular pump with the magnetic bearing device mounted thereto.

BACKGROUND ART

With the development of electronics in recent years, demands for semiconductors for forming memories, integrated circuits, etc. are rapidly increasing. Those semiconductors are manufactured such that impurities are doped into a semiconductor substrate with an extremely high purity to impart electrical properties thereto, or semiconductor substrates with minute circuit patterns formed thereon are laminated. Those manufacturing steps must be performed in a chamber with a high vacuum state so as to avoid influences of dust etc. in the air. This chamber is generally evacuated by using a vacuum pump as a pumping system. In particular, a turbo molecular pump, which is one of the vacuum pumps, is widely used since the turbo molecular pump entails little residual gas, is easy of maintenance, and has other such characteristics.

The semiconductor manufacturing process includes a number of steps in which various process gases are caused to act onto a semiconductor substrate, and the turbo molecular pump is used not only to evacuate the chamber but also to discharge those process gases from the chamber. Further, in equipment for an electron microscope etc., the turbo molecular pump is used to create a high vacuum state in the chamber of the electron microscope etc. in order to prevent refraction etc. of an electron beam caused by the presence of dust or the like.

Such the turbo molecular pump is composed of a turbo molecular pump main body for sucking and discharging gas from the chamber of a semiconductor manufacturing apparatus, an electron microscope, or the like, and a control device for controlling the turbo molecular pump main body. FIG. 10 is a vertical sectional view of the turbo molecular pump main body.

In FIG. 10, a turbo molecular pump main body 100 includes an outer cylinder 127 with an inlet port 101 formed on the top thereof. Provided inside the outer cylinder 127 is a rotor 103 having in its periphery a plurality of rotary vanes 102a, 102b, 102c, ... serving as turbine blades for sucking and discharging gas, formed radially in a number of stages. At the center of the rotor 103, a rotor shaft 113 is mounted while being supported in a levitating state in the air and controlled in position, for example, by a 5-axis control magnetic bearing.

Upper radial electromagnets 104 are provided by arranging four electromagnets in pairs in X- and Y-axis and plus- and minus-side directions (not shown.; those electromagnets are denoted by 104X+, 104X−, 104Y+, and 104Y−, as necessary). Further, there is provided an upper radial sensor 107 constituted of four electromagnets arranged in close proximity to and in correspondence with the upper radial electromagnets 104. The upper radial sensor 107 detects radial displacement of the rotor 103, transmitting a signal to a control device (not shown).

In this control device, the upper radial electromagnets 104 are controlled through excitation by an amplifier circuit 150 (to be described later), through a compensation circuit having a PID adjusting function, on the basis of a displacement signal detected by the upper radial sensor 107, which adjusts the radial position of the upper portion of the rotor shaft 113.

The rotor shaft 113 is formed of a high-magnetic-permeability material (e.g., iron) and is adapted to be attracted by the magnetic force of the upper radial electromagnets 104. Such adjustment is conducted independently in the X-axis direction and the Y-axis direction.

Further, lower radial electromagnets 105 and a lower radial sensor 108 are arranged in the same way as the upper radial electromagnets 104 and the upper radial sensor 107. Like the radial position of the upper portion of the rotor shaft 113, the radial position of the lower portion of the rotor shaft 113 is adjusted (the lower radial electromagnets 105 are similarly denoted by 105X+, 105X−, 105Y+, and 105Y−, as necessary).

Further, axial electromagnets 106A and 106B are arranged on the upper and lower sides of a circular metal disc 111 provided in the lower portion of the rotor shaft 113. The metal disc 111 is formed of a high-magnetic-permeability material such as iron. To detect axial displacement of the rotor shaft 113, an axial sensor 109 is provided, which transmits an axial displacement signal thereof to the control device.

The axial electromagnets 106A and 106B are controlled through excitation by the amplifier circuit 150, through the compensation circuit having a PID adjusting function of the control device on the basis of the axial displacement signal. The axial electromagnet 106A upwardly attracts the magnetic disc 111 by the magnetic force, and the axial electromagnet 106B downwardly attracts the magnetic disc 111.

In this way, the control device has a function to appropriately control the magnetic force exerted on the metal disc 111 by the axial electromagnets 106A and 106B, magnetically levitate the rotor shaft 113 in the axial direction, and retain the rotor shaft 113 in the space in a non-contact state.

Note that descriptions will be given later in more detail on the amplifier circuit 150 that drives, through excitation, the upper radial electromagnets 104, the lower radial electromagnets 105, and the axial electromagnets 106A and 106B.

Meanwhile, a motor 121 is equipped with a plurality of magnetic poles, which are arranged circumferentially to surround the rotor shaft 113. The magnetic poles are respectively controlled by the control device to rotate the rotor shaft 113 through an electromagnetic force acting between the rotor shaft 113 and the magnetic poles.

In addition, the motor 121 also has an RPM sensor (not shown) incorporated to output a detection signal, which is used for detection of RPM of the rotor shaft 113. A phase sensor (not shown) is attached, for example, in the vicinity of the lower radial sensor 108 to detect the phase of rotation of the rotor shaft 113. From detection signals of the phase sensor and the RPM sensor both, the control device detects positions of the magnetic poles.

A plurality of stationary vanes 123a, 123b, 123c, . . . are arranged so as to be spaced apart from the rotary vanes 102a, 102b, 102c, . . . by small gaps. To downwardly transfer the molecules of exhaust gas through collision, the rotary vanes 102a, 102b, 102c, . . . are inclined by a predetermined angle with respect to a plane perpendicular to the axis of the rotor shaft 113. Similarly, the stationary vanes 123 are also inclined by a predetermined angle with respect to a plane perpendicular to the axis of the rotor shaft 113, and extend toward the inner side of the outer cylinder 127 to be arranged alternately with the rotary vanes 102.

The stationary vanes 123 are supported at one end by being inserted into gaps between a plurality of stationary vane spacers 125a, 125b, 125c, . . . stacked together in stages. The stationary vane spacers 125 are ring-shaped members, which are formed of a metal, such as aluminum, iron, stainless steel, or copper, or a metal such as an alloy containing such the metal as a component.

In the outer periphery of the stationary vane spacers 125, the outer cylinder 127 is secured in position with a small gap therebetween. At the bottom of the outer cylinder 127, there is arranged a base portion 129, and a threaded spacer 131 is arranged between the lower portion of the stationary vane spacers 125 and the base portion 129. In the portion of the base portion 129 below the threaded spacer 131, there is formed a exhaust port 133 which communicates with the outside.

The threaded spacer 131 is a cylindrical member formed of a metal, such as aluminum, copper, stainless steel, or iron, or a metal such as an alloy containing such the metal as a component, and has a plurality of spiral thread grooves 131a in its inner peripheral surface. The spiral direction of the thread grooves 131a is determined such that when the molecules of the exhaust gas move in the rotating direction of the rotor 103, these molecules are transferred toward the exhaust port 133.

Connected to the lowermost one of the rotary vanes 102a, 102b, 102c, . . . of the rotor 103 is a rotary vane 102d, which extends vertically downwards. The outer peripheral surface of the rotary vane 102d in a cylindrical shape sticks out toward the inner peripheral surface of the threaded spacer 131, and is in close proximity to the inner peripheral surface of the threaded spacer 131 with a predetermined gap therebetween.

The base portion 129 is a disc-like member constituting the base of the turbo molecular pump main body 100, and is generally formed of a metal, such as iron, aluminum, or stainless steel. The base portion 129 physically retains the turbo molecular pump main body 100, and also functions as a heat conduction passage. Thus, the base portion 129 is desirably formed of a metal that is rigid and high in heat conductivity, such as iron, aluminum, or copper.

In the above-mentioned construction, when the rotary vanes 102 are driven by the motor 121 to be rotated together with the rotor shaft 113, an exhaust gas from a chamber is sucked in through the inlet port 101 by the action of the rotary vanes 102 and the stationary vanes 123.

The exhaust gas sucked in through the inlet port 101 passes between the rotary vanes 102 and the stationary vanes 123, and is transferred to the base portion 129. At this time, the temperature of the rotary vanes 102 is raised by frictional heat generated when the exhaust gas comes into contact with the rotary vanes 102 and by heat generated and conducted from the motor 121. Such heat is transferred to the stationary vanes 123 through radiation or through conduction of gas molecules of exhaust gas or the like.

The stationary vane spacers 125 are joined to one another on the outer periphery and transmit, to the outside, heat received by the stationary vanes 123 from the rotary vanes 102 as well as frictional heat generated upon contact between exhaust gas and the stationary vanes 123. The exhaust gas transferred to the base portion 129 is sent to the exhaust port 133 while being guided by the thread grooves 131a of the threaded spacer 131.

Herein, the turbo molecular pump requires control based on individually adjusted specific parameters (e.g., identification of the model and characteristics corresponding to the model). To store the control parameters, the turbo molecular pump main body 100 contains an electronic circuit portion 141 in its main body. The electronic circuit portion 141 is composed of a semiconductor memory, such as EEP-ROM, electronic parts, such as semiconductor devices for access to the semiconductor memory, a substrate 143 for mounting these components thereto, etc. This electronic circuit portion 141 is accommodated under an RPM sensor (not shown) near the center of the base portion 129 constituting the lower portion of the turbo molecular pump main body 100, and is closed by a hermetic bottom cover 145.

Given next is a detailed description of the amplifier circuit for driving, through excitation, the upper radial electromagnets 104, the lower radial electromagnets 105, and the axial electromagnets 106A and 106B of the turbo molecular pump main body 100 structured as above. Patent Document 1 is known as a conventional example of the amplifier circuit.

FIG. 11 shows a diagram of a conventional amplifier circuit. Electromagnet coils 151, 151, . . . which respectively constitute the electromagnets 104, 105, 106A, and 106B are elements present on the turbo molecular pump main body 100 side. The electromagnet coils are shown for simplicity.

In FIG. 11, the electromagnet coil 151 is connected at one end 151a to a transistor 161 and a diode 165, while the electromagnet coil 151 is connected at the other end 151b to a transistor 162 and a diode 166 through an electromagnetic current detecting circuit 155.

Herein, the transistors 161 and 162 are both power MOS-FETs. The transistor 161 has a drain terminal 161a connected to a positive electrode 153a of a power source 153 and has a source terminal 161b connected to the one end 151a of the electromagnet coil 151. The transistor 162 has a drain terminal 162a connected to the other end 151b of the electromagnet coil 151 through the electromagnetic current detecting circuit 155 and has a source terminal 162b connected to a negative electrode 153b of the power source 153.

In addition, the diodes 165 and 166 are both provided for current regeneration. The diode 165 has a cathode terminal 165a connected to the one end 151a of the electromagnet coil 151 and has an anode terminal 165b connected to the negative electrode 153b. Similarly, the diode 166 has a cathode terminal 166a connected to the positive electrode 153a and has an anode terminal 166b connected to the other end 151b of the electromagnet coil 151 through the electromagnetic current detecting circuit 155.

The electromagnetic current detecting circuit 155 connected to the other end 151b of the electromagnet coil 151 is, for example, a hole sensor type current sensor, and detects the amount of a current flowing in the electromagnet coil 151 (hereinafter referred to as "electromagnetic current iL") to output an electromagnetic current detection signal 173 as the detection result to an amplifier control circuit 171 (to be described later) Also, provided between the positive electrode 153a and the negative electrode 153b of the power source 153 is a capacitor (not shown) for stabilizing the power source 153.

The amplifier circuit 150 configured as described above is provided for each of the electromagnet coils 151, 151, . . . which respectively constitute the electromagnets 104, 105, 106A, and 106B.

The amplifier control circuit 171 is a circuit within a digital signal processor portion (hereinafter referred to as "DSP portion") (not shown) of the control device. The amplifier control circuit 171 compares the value of the electromagnetic current iL detected by the electromagnetic current detecting circuit 155 and a current command value. Based on the comparison result, the pulse width time of each of gate drive signals 174 and 175 to be outputted to the gate terminals of the transistors 161 and 162 is determined within a control cycle Ts, which is one cycle by PWM control.

In the above-mentioned structure, when the transistors 161 and 162 of the amplifier circuit 150 are both turned on, the electromagnetic current iL is increased due to a current supplied from the positive electrode 153a to the negative electrode 153b through the transistor 161, the electromagnet coil 151, and the transistor 162. On the other hand, when the transistors 161 and 162 are both turned off, the electromagnetic current iL is decreased due to a current regenerated from the negative electrode 153b to the positive electrode 153a through the diode 165, the electromagnet coil 151, and the diode 166.

In this case, when the value of the electromagnetic current iL detected by the electromagnetic current detecting circuit 155 is smaller than the current command value, control is performed such that the electromagnetic current iL is increased in the amplifier control circuit 171. Therefore, as shown in FIG. 12, in one control cycle Ts, the pulse width time during which the transistors 161 and 162 are both kept turned on is set to be longer than the pulse width time during which the transistors 161 and 162 are both kept turned off. As a result, the electromagnetic current iL in one control cycle Ts is increased since an increasing time Tp1 for the electromagnetic current iL is set to be longer than a decreasing time Tp2 for the electromagnetic current iL.

On the other hand, when the value of the electromagnetic current iL detected by the electromagnetic current detecting circuit 155 is larger than the current command value, control is performed such that the electromagnetic current iL is decreased in the amplifier control circuit 171. Therefore, as shown in FIG. 12, in one control cycle Ts, the pulse width time during which the transistors 161 and 162 are both kept turned off is set to be longer than the pulse width time during which the transistors 161 and 162 are both kept turned on. As a result, the electromagnetic current iL in one control cycle Ts is decreased since the decreasing time Tp2 for the electromagnetic current iL is set to be longer than the increasing time Tp1 for the electromagnetic current iL.

By the settings, the electromagnetic current iL in the control cycle Ts can be appropriately increased or decreased, so the value of the electromagnetic current iL and the current command value can be made to be the same.

Note that the detection of the electromagnetic current iL in the electromagnetic current detecting circuit 155 is performed once at the same detection timing Td in the control cycle Ts as shown in FIG. 12.

Patent Document 1: JP 3176584 B (FIG. 8 and FIG. 9)

As described above, the amplifier circuit 150 is provided for each of the electromagnet coils 151, 151, . . . which respectively constitute the electromagnets 104, 105, 106A, and 106B, so, in the case of a magnetic bearing in a five axis control, ten amplifier circuits 150 are provided in the control device. The respective amplifier circuits 150 are each constituted of a bridged circuit which is composed of two transistors 161 and 162 and two diodes 165 and 166 as shown in FIG. 11, so twenty transistors and twenty diodes are required for driving, through excitation, all the electromagnet coils 151, 151, . . . .

As a result, the amplifier circuit 150 is composed of a large number of elements, so it is difficult to reduce the size of the amplifier circuit 150, and it is also difficult to reduce the size of the entirety of the turbo molecular pump. In view of this, a large space is required when the turbo molecular pump is installed in the clean room or the like, so there is a fear of increasing the costs of installation. Also, there is a fear of increasing the failure rate because the number of elements constituting the amplifier circuit 150 is increased. In addition, there is a fear of increasing power consumption and heat generation within the amplifier circuit 150. Further, there is a fear of increasing the manufacturing costs or the like of the amplifier circuit 150 itself because of the increase in the number of the elements.

In addition, the electromagnet coil 151 is an element provided to the turbo molecular pump main body 100 side as shown in FIG. 11, so nodes at both ends 151a and 151b (these nodes are respectively referred to as "node R" and "node S") of the electromagnet coil 151 are wirings constituting a cable between the control device and the turbo molecular pump main body 100. Considering that ten amplifier circuits 150 are provided in the control device, twenty wirings serving as nodes R and S are assumed to be provided in the cable between the control device and the turbo molecular pump main body 100. As a result, it is necessary to increase the number of cores for the cable between the control device and the turbo molecular pump main body 100, or it is necessary to increase the size of a connector (not shown) serving as a port of the cable at the turbo molecular pump main body 100 side, so there is a fear that the respective costs of parts are increased.

Further, in control of a conventional amplifier circuit 150, the electromagnetic current iL is always increased or decreased within the control cycle Ts (that is, not constant) as shown in FIG. 12. Thus, the electromagnetic current iL is in a transient state at a detection timing Td for detecting the electromagnetic current iL. In view of this, when only a small gap or the like is generated between the detection timing Td and a waveform of an actual electromagnetic current iL, there is a fear of generating a large error with respect to the value of the electromagnetic current iL that is intended to be detected. Further, when the increase and decrease of the electromagnetic current iL is switched in the vicinity of the detection timing Td, noise may be generated within the amplifier circuit 150, or noise may be allowed to overlap the positive electrode 153a and the negative electrode 153b of the power source 153, which leads to a fear of generating the detection error.

SUMMARY OF THE INVENTION

The present invention has been made in view of the above-mentioned conventional problems, and an object of the present invention is to provide a magnetic bearing device capable of reducing the costs required for the manufacture, installation, or the like of a turbo molecular pump by reducing the number of elements of an amplifier circuit that drives electromagnets through excitation, and capable of reducing an error at the time of detecting a current flowing through the electromagnets, and a turbo molecular pump with the magnetic bearing device mounted thereto.

Accordingly, the present invention relates to a magnetic bearing device including: a rotor; a plurality of electromagnets for controlling a radial position and/or an axial position of the rotor; a power source for supplying power to the electromagnets; a common node commonly connected to each one end of the electromagnets; switch means for switching a voltage of the common node; and excitation control means for controlling excitation of each of the electromagnets by a supply current supplied from the other end of one of the electromagnets to a negative electrode of the power source, or by a regenerated current regenerated from the other end of one of the electromagnets to a positive electrode of the power source, in which the switch means includes: a first switch element for connecting and disconnecting between the positive electrode and the common node; and a first rectifier element for causing a current to flow from the negative electrode to the common node, and the excitation control means includes: a second switch element for connecting and disconnecting between the other end of one of the electromagnets and the negative electrode; and a second rectifier element for causing a current to flow from the other end of one of the electromagnets to the positive electrode.

When the second switch element of the excitation control means is connected and the first switch element of the switch means is connected, the supply current is caused to flow, thereby increasing the electromagnetic current. On the other hand, when the second switch element is disconnected and the first switch element is disconnected, the regenerated current is caused to flow, thereby decreasing the electromagnetic current. In view of this, even when the excitation control means is merely composed of one switch element and one rectifier element, the excitation control means is controlled while performing control of the switch means, thereby making it possible to control excitation of the electromagnets by increasing or decreasing the electromagnetic current.

With the elements that constitute the excitation control means reduced in number, the failure rate of the magnetic bearing device having the excitation control means can be lowered. In addition, power consumption or heat generation in the magnetic bearing device can be also reduced. Further, since the excitation control means is not a so-called regulator circuit, there is no need to provide a capacitor for stabilization to the common node, and a choking coil or the like for protection, thereby making it also possible to reduce the respective costs of the parts or the like.

It should be noted that, when the second switch element is connected and the first switch element is disconnected, or when the second switch element is disconnected and the first switch element is connected, a flywheel current is caused to flow from the other end of the electromagnet to the positive electrode or to the negative electrode, thereby making it possible to maintain the electromagnetic current to be constant.

Further, the present invention relates to a magnetic bearing device including: a rotor; a plurality of electromagnets for controlling a radial position and/or an axial position of the rotor; a power source for supplying power to the electromagnets; a common node commonly connected to each one end of the electromagnets; switch means for switching a voltage of the common node; and excitation control means for controlling excitation of each of the electromagnets by a supply current supplied from a positive electrode of the power source to the other end of one of the electromagnets, or by a regenerated current regenerated from a negative electrode of the power source to the other end of one of the electromagnets, in which the switch means includes: a first switch element for connecting and disconnecting between the common node and the negative electrode; and a first rectifier element for causing a current to flow from the common node to the positive electrode, and the excitation control means includes: a second switch element for connecting and disconnecting between the positive electrode and the other end of one of the electromagnets; and a second rectifier element for causing a current to flow from the negative electrode to the other end of one of the electromagnets.

When the second switch element of the excitation control means is connected and the first switch element of the switch means is connected, the supply current is caused to flow, thereby increasing the electromagnetic current. On the other hand, when the second switch element is disconnected and the first switch element is disconnected, the regenerated current is caused to flow, thereby decreasing the electromagnetic current.

In view of this, even when the excitation control means is merely composed of one switch element and one rectifier element, it is possible to control excitation of the electromagnet by increasing or decreasing the electromagnetic current. Accordingly, it becomes possible to select the excitation control means and the switch means that are easy to be designed and controlled.

It should be noted that, also in this case, when the second switch element is connected and the first switch element is disconnected, or when the second switch element is disconnected and the first switch element is connected, a flywheel current is caused to flow from the other end of the electromagnet to the positive electrode or to the negative electrode, thereby making it possible to maintain the electromagnetic current to be constant.

Further, the present invention relates to the magnetic bearing device characterized in that the current caused to flow through each of the electromagnets is increased, decreased, or maintained to be constant by adjusting a switching phase of the switch means and a control phase of the excitation control means within a common control cycle.

The switching phase of the switch means and the control phase of the excitation control means are adjusted within the common control cycle, thereby making it possible to constitute the circuit with less elements and with ease. In addition, any one of the supply current, the regenerated current, and the flywheel current can be caused to flow through the electromagnet within the control cycle. As a result, the current flowing through the electromagnet can be increased, decreased, or maintained to be constant.

Further, the present invention relates to the magnetic bearing device characterized in that the first rectifier element includes a third switch element connected in parallel therewith.

The third switch element is connected when a current is caused to flow through the first rectifier element of the switch means, thereby making it possible to suppress the heat generated in the first rectifier element.

Further, the present invention relates to a magnetic bearing device including: a rotor; a plurality of electromagnets for controlling a radial position and/or an axial position of the rotor; a power source for supplying power to the electromagnets; a common node commonly connected to each one end of the electromagnets; switch means for switching a voltage of the common node; a first excitation control means for controlling excitation of at least one of the plurality of electromagnets by a supply current supplied from the other end of one of the electromagnets to a negative electrode of the power source, or by a regenerated current regenerated from the other end of one of the electromagnets to a positive electrode of the power source; and a second excitation control means for controlling excitation of electromagnets other than the at least one electromagnet controlled through excitation by the first excitation control means, by a supply current supplied from the positive electrode to the other end of another one of the electromagnets, or by a regenerated current regenerated from the negative electrode to the other end of the another one of the electromagnets, in which the switch means includes: a switch element for connecting and disconnecting between the common node and the negative electrode, and a switch element for connecting and disconnecting between the positive electrode and the common node; and a rectifier element for causing a current to flow from the common node to the positive electrode, and causing a current to flow from the negative electrode to the common node, respectively, the first excitation control means includes: a switch element for connecting and disconnecting between the other end of one of the electromagnets and the negative electrode; and a rectifier element for causing a current to flow from the other end of the one of the electromagnets to the positive electrode, and the second excitation control means includes: a switch element for connecting and disconnecting between the positive electrode and the other end of another one of the electromagnets; and a rectifier element for causing a current from the negative electrode to the other end of the another one of the electromagnets.

The switch means includes a switch element for connecting and disconnecting between the common node and the negative electrode and between the positive electrode and the common node, and a rectifier element for causing a current to flow from the common node to the positive electrode, and from the negative electrode to the common node. With such the structure, even when the plurality of electromagnets are divided into electromagnets controlled by the first excitation control means, and such magnets controlled by the second excitation control means, it is possible to control excitation of the electromagnets by increasing or decreasing the electromagnetic current.

It should be noted that, in the switch means, it is preferable to connect or disconnect the switch element so that the connection between the common node and the negative electrode does not overlap the connection between the positive electrode and the common node. As a result, a through current flowing from the positive electrode to the negative electrode can be prevented.

Further, the present invention relates to the magnetic bearing device characterized in that the current caused to flow through each of the electromagnets is increased, decreased, or maintained to be constant by adjusting a switching phase of the switch means and control phases of the first excitation control means and the second excitation control means within a common control cycle.

The switching phase of the switch means and the control phases of the first excitation control means and the second excitation control means are adjusted within the common control cycle, thereby making it possible to constitute the circuit with less elements and with ease. In addition, any one of the supply current, the regenerated current, and the flywheel current can be caused to flow through the electromagnet within the control cycle.

Further, the present invention relates to the magnetic bearing device characterized in that the plurality of electromagnets are constituted by being divided into two groups, one controlled by the first excitation control means and the other controlled by the second excitation control means so that the current caused to flow between the positive electrode and the common node and the current caused to flow between the common node and the negative electrode are made substantially equalized.

The plurality of electromagnets are divided into groups so that the electromagnetic currents flowing through the common node are substantially equalized, thereby making it possible to reduce the size of the switch element constituting the switch means or that of the rectifier element. In addition, currents flowing through those elements can also be reduced, so it is possible to prevent heat generation or the like. Further, the current to be supplied from the power source can also be reduced, so it is possible to reduce an input power supply capacity.

Further, the present invention relates to the magnetic bearing device, characterized by further including current detecting means for detecting a value of the current when a constant current is caused to flow through the electromagnets.

It is possible to maintain the electromagnetic current to be constant by causing a flywheel current to flow through the electromagnet, so the current detecting means detects the electromagnetic current at this time.

Accordingly, there is no need to detect the electromagnetic current in the transient state, so even when a deviation or the like is caused between the detection timing and the actual waveform of the electromagnetic current, a large error is not caused with respect to the value of the electromagnetic current that is intended to be detected. Further, it is possible to prevent switching between the increase and decrease of the electromagnetic current at about the detection timing, thereby making it possible to reduce noise generated in the excitation control means, the positive electrode, or the negative electrode, to reduce detection errors.

Further, the present invention relates to the magnetic bearing device characterized in that the current detecting means includes a resistance having one end connected to the negative electrode, and a detection portion for detecting a current flowing through the resistance.

As a result, a high voltage is not inputted to the current detecting means, so noise is not likely to be allowed to overlap when the electromagnetic current is detected, and the electromagnetic current can be detected with accuracy.

Further, the present invention relate to a turbo molecular pump including the magnetic bearing device mounted thereto characterized in that: the rotor has rotary vanes and a rotor shaft placed at the center of the rotary vanes; and each of the electromagnets levitates the rotor shaft by a magnetic force.

The above-mentioned magnetic bearing device is mounted on the turbo molecular pump, so the entirety of the turbo molecular pump can be reduced in size. Therefore, it is possible to reduce the costs for installing the turbo molecular pump in a clean room or the like.

Further, the present invention relates to the turbo molecular pump, characterized in that the turbo molecular pump includes: a turbo molecular pump main body having the rotor and the electromagnets; and a control device having the switch means and the excitation control means, or the switch means, the first excitation control means, and the second excitation control means, and in that: the turbo molecular pump main body and the control device are integrated into one.

The above-mentioned excitation control means, or the first excitation control means and the second excitation control means can be reduced in size, so it is also possible to reduce the size of the control device including the excitation control means or the like Accordingly, the control device and the turbo molecular pump main body can be integrated in to one, there by making it possible to further reduce the costs of the manufacture, installation, or the like of the turbo molecular pump.

EFFECTS OF THE INVENTION

According to the present invention, as described above, the magnetic bearing device is composed of the switch means for switching the voltage of the common node, and the excitation control means for controlling excitation of each of the plurality of electromagnets by the supply current or the regenerated current. Accordingly, even when the excitation control means is merely composed of one switch element and one rectifier element, the excitation control means is controlled while performing control of the switch means, thereby making it possible to control excitation of the electromagnets by increasing or decreasing the electromagnetic current. Therefore, the elements of the excitation control means can be reduced in number, thereby making it possible to reduce the costs of manufacture, installation, or the like of the turbo molecular pump.

Further, the magnetic bearing device includes the current detecting means for detecting the value of the current when the constant current flows through the electromagnet, so there is no need to detect the value of the electromagnetic current in the transient state, thereby making it possible to reduce the error in detecting the value.

DETAILED DESCRIPTION OF THE PREFERRED EMBODIMENTS

Hereinafter, description will be made of a first embodiment of the present invention.

FIG. 1 shows a circuit diagram of an amplifier circuit according to the first embodiment of the present invention. Note that components identical with those of FIG. 11 are denoted by the same reference symbols, and descriptions thereof are omitted.

In FIG. 1, a turbo molecular pump main body 200 has the electromagnet coils 151, 151, . . . which respectively constitute electromagnets 104, 105, 106A, and 106B, and are provided with a common node (which will be referred to as "common node C"). One end 151a of each electromagnet coil 151 is connected to the common node C. The other end 151b of the electromagnet coil 151 is connected to a transistor 261 and a diode 265 that compose an amplifier circuit 250 (note that a node at the other end 151b will be referred to as "node E")

Herein, the transistor 261 is a power MOSFET, and has a drain terminal 261a connected to the other end 151b of the electromagnet coil 151 and a source terminal 261b connected to the negative electrode 153b of the power source 153 through a current detecting circuit 255. A diode 265 is one for current regeneration or a flywheel diode, and has a cathode terminal 265a connected to a positive electrode 153a of the power source 153 and an anode terminal 265b connected to the other terminal 151b of the electromagnet coil 151.

The current detecting circuit 255 connected to the source terminal 261b of the transistor 261 has a detection resistor 256 which is connected at one end to the negative electrode 153b and at the other end to the source terminal 261b of the transistor 261, and a detector portion 257 for detecting the electromagnetic current iL from voltage at the other end of the detection resistor 256. The detector portion 257 is structured to detect the electromagnetic current iL flowing through the electromagnet coil 151 and output a current detection signal 273 as a detection result to an amplifier control circuit 271 to be described later. Note that by using the current detecting circuit 255 thus having the detection resistor 256 connected at the one end to the negative electrode 153b, the current detecting circuit 255 does not receive an input of high voltage, so noise hardly develops upon detection of the electromagnetic current iL, allowing the electromagnetic current iL to be detected with accuracy.

The amplifier circuit 250 structured as described above is provided to each of the electromagnet coils 151, 151, . . . which respectively constitute the electromagnets 104, 105, 106A, and 106B.

The amplifier control circuit 271 is provided within a DSP portion (not shown) similarly to the conventional art. The amplifier control circuit 271 compares a value of the electromagnetic current iL detected by the current detecting circuit 255 and a current command value, and determines a time (the above-mentioned increasing time Tp1) for increasing the electromagnetic current iL and a time (the above-mentioned decreasing time Tp2) for decreasing the electromagnetic current iL. Based on those times, the amplifier control circuit 271 determines a pulse width time of a gate drive signal 274 outputted to a gate terminal of the transistor 261 within the control cycle Ts corresponding to one cycle performed by PWM control. Note that in outputting the gate drive signal 274, a signal outputted from the amplifier control circuit 271 may be passed through a Field Programable Gate Array (not shown; hereinafter, referred to as "FPGA") before the gate drive signal 274 is outputted to the transistor 261, thereby allowing a fast speed operation.

Further, in FIG. 1, a common node C of the amplifier circuit 250 is connected to a switch circuit 280. In the switch circuit 280, the common node C is connected to a transistor 281 and a diode 285.

The diode 285 is one for current regeneration or a flywheel diode, and has a cathode terminal 285a connected to the common node C and an anode terminal 285b connected to the negative electrode 153b of the power source 153 shared by the amplifier circuit 250. The transistor 281 is a power MOSFET, and has a drain terminal 281a connected to the positive electrode 153a of the power source 153 and a source terminal 281b connected to the common node C. The transistor 281 has a gate terminal to which a switch signal 276 is outputted from the amplifier control circuit 271. The amplifier control circuit 271 is structured to determine a pulse width time of the switch signal 276 outputted to the gate terminal of the transistor 281 within the same control cycle Ts as performed by the control on the amplifier circuit 250.

In the above-mentioned structure, when the transistor 261 of the amplifier circuit 250 and the transistor 281 of the switch circuit 280 are respectively turned on, a current is made to flow from the positive electrode 153a to the negative electrode 153b through the transistor 281, the common node C, the electromagnet coil 151, and the transistor 261 (and the current detecting circuit 255). Accordingly, the current is supplied to the electromagnet coil 151 from the positive electrode 153a of the power source 153, which increases the electromagnetic current iL (this state will be referred to as "increasing mode A1").

On the other hand, when the transistor 261 of the amplifier circuit 250 and the transistor 281 of the switch circuit 280 are respectively turned off, a regenerated current is made to flow from the negative electrode 153b to the positive electrode 153a through the diode 285, the common node C, the electromagnet coil 151, and the diode 265 due to a counter electromotive force caused by the electromagnet coil 151. Accordingly, electromagnetic energy generated from the electromagnet coil 151 is consumed, which decreases the electromagnetic current iL (this state will be referred to as "decreasing mode A2").

Further, when the transistor 261 of the amplifier circuit 250 is turned on and the transistor 281 of the switch circuit 280 is turned off, a flywheel current is made to flow from the negative electrode 153b to the negative electrode 153b through the diode 285, the common node C, the electromagnet coil 151, and the transistor 261 (and the current detecting circuit 255) due to the counter electromotive force caused by the electromagnet coil 151. At this time, an electric potential difference does not occur between the both ends 151a and 151b of the electromagnet coil 151, which maintains the substantially constant electromagnetic current iL (this state will be referred to as "constant mode A3").

Further, even in the case other than the constant mode A3, when the transistor 261 of the amplifier circuit 250 is turned off and the transistor 281 of the switch circuit 280 is turned on, a flywheel current is made to flow from the positive electrode 153a to the positive electrode 153a through the transistor 281, the common node C, the electromagnet coil 151, and the diode 265 due to the counter electromotive force caused by the electromagnet coil 151. Accordingly, the substantially constant electromagnetic current iL is maintained also in this case (this state will be referred to as "constant mode A4").

Herein, FIG. 2 is a time chart showing how adjustment is made between control phases of the amplifier circuit 250 with respect to the transistor 261 etc. and switch phases of the switch circuit 280 with respect to the transistor 281 etc.

In FIG. 2, control is performed with respect to the switch circuit 280 such that the time during which the transistor 281 is kept turned on and the time during which the transistor 281 is kept turned off within the control cycle Ts are the same. Herein, during the time from a time (time 0) at the beginning of the control cycle Ts to a time (time 0.5 Ts) at a midpoint of the control cycle Ts, the transistor 281 is kept turned off. Therefore, the voltage of the common node C becomes substantially the same voltage (hereinafter, referred to as "voltage VL") as that of the negative electrode 153b due to the counter electromotive force or the like generated by the electromagnetic coil 151. On the other hand, during the time from the time (time 0.5 Ts) at the midpoint of the control cycle Ts to an end (time Ts) of the control cycle Ts, the transistor 281 is kept turned on. Thus, the voltage of the common node C becomes substantially the same voltage (hereinafter referred to as "voltage VH") as that of the positive electrode 153a.

In the case where the value of the electromagnetic current iL detected by the current detecting circuit 255 is smaller than the current command value, control is performed such that the electromagnetic current iL is increased in the amplifier control circuit 271. In this case, control is performed such that the state of the increasing mode A1 is maintained only during the increasing time Tp1 described above in one control cycle Ts. In other times, control is performed such that the state of the constant mode A3 or A4 is maintained. To be specific, during the time from the time 0.5 Ts to the time Ts, the transistor 281 of the switch circuit 280 is kept turned on, so with the time 0.5 Ts as a starting point, the transistor 261 is kept turned on only during the time Tp1, thereby setting the state of the increasing mode A1 only for the increasing time Tp1. Further, after the time Tp1 has elapsed, the transistor 261 is turned off to thereby set the state of the constant mode A4. On the other hand, during the time from the time 0 to the time 0.5 Ts, the transistor 281 of the switch circuit 280 is kept turned off (that is, the state of the increasing mode A1 cannot be set), so the transistor 261 is turned on, thereby setting the state of the constant mode A3. As a result, the electromagnetic current iL is increased in one control cycle Ts only during the increasing time Tp1.

On the other hand, in the case where the value of the electromagnetic current iL detected in the current detecting circuit 255 is larger than the current command value, control is performed such that the electromagnetic current iL is decreased in the amplifier control circuit 271. In this case, control is performed such that the state of the decreasing mode A2 is maintained only during the above-mentioned decreasing time Tp2 in one control cycle Ts. In other times, control is performed such that the state of the constant mode A3 or A4 is maintained. To be specific, during the time from the time 0 to the time 0.5 Ts, the transistor 281 of the switch circuit 280 is kept turned off, so until the time 0.5 Ts as an end point, the transistor 261 is kept turned off only during the time Tp2, thereby setting the state of the decreasing mode A2 only for the decreasing time Tp2. Until the transistor 261 is turned off, the transistor 261 is kept turned on, thereby setting the state of the constant mode A3. On the other hand, during the time from the time 0.5 Ts to the time Ts, the transistor 281 of the switch circuit 280 is kept turned on (that is, the state of the decreasing mode A2 cannot be set), so the transistor 261 is turned off, thereby setting the state of the constant mode A4. As a result, the electromagnetic current iL is decreased in one control cycle Ts only during the decreasing time Tp2.

Further, in the case where the value of the electromagnetic current iL detected in the current detecting circuit 255 coincides with the current command value, control is performed such that the electromagnetic current iL is kept constant in the amplifier control circuit 271. In this case, control is performed such that the state of the constant mode A3 or A4 is always maintained in one control cycle Ts. To be specific, during the time from the time 0 to the time 0.5 Ts, the transistor 281 of the switch circuit 280 is kept turned off, so the transistor 261 is turned on, thereby setting the state of the constant mode A3. On the other hand, during the time from the time 0.5 Ts to the time Ts, the transistor 281 of the switch circuit 280 is kept turned on, so the transistor 261 is turned off, thereby setting the state of the constant mode A4. As a result, the electromagnetic current iL is kept constant.

According to the above structure, even when the amplifier circuit 250 is composed of only one transistor 261 and one diode 265, an increase, decrease, or constant state of the electromagnetic current iL can thus be maintained by controlling the amplifier circuit 250 while controlling the switch circuit 280. Thus, the value of the electromagnetic current iL can be made to coincide with the current command value. Due to such the structure of the amplifier circuit 250, the elements of the amplifier circuit 250 are reduced in number, thereby making it possible to miniaturize the turbo molecular pump as a whole to reduce the costs for installing the turbo molecular pump in a clean room or the like. Further, the elements of the amplifier circuit 250 are reduced in number, so it is possible to decrease a failure rate of the amplifier circuit 250, and power consumption and heat generation therein. Still further, the manufacture costs of the amplifier circuit 250 can also be reduced.

Unlike the control with respect to the conventional amplifier circuit 150, in control of the amplifier circuit 250 of this embodiment, the electromagnetic current iL can be maintained constant. Therefore, ripples of the current flowing through the common node C can be reduced, thereby making it possible to reduce power consumption and heat generation in the amplifier circuit 250 and the switch circuit 280.

Further, the switch circuit 280 of the present invention is not a so-called regulator circuit (that is, not such a circuit as to maintain the voltage of the common node C constant) Therefore, it is not required to provide a capacitor (not shown) for stabilization, a choking coil (not shown) for protection, or the like to the common node C. Thus, the costs of parts can be reduced.

Further, wirings between the amplifier circuit 250 and the electromagnet coils 151 include only one common node C and 10 nodes E of the other ends 151b of the electromagnet coils 151. Therefore, there are provided only 11 wirings as the common node C and the nodes E (conventionally, 20 wirings are required) Accordingly, it is possible to reduce the costs of cables between the control device and the turbo molecular pump main body 200, and the costs of a connector (not shown) of the turbo molecular pump main body 200. Therefore, the costs of parts can be reduced. Further, miniaturization of the amplifier circuit 250 leads to miniaturization of the control device (not shown) itself, so a function of the control device can easily be incorporated into the turbo molecular pump main body 200 side. Accordingly, the control device and the turbo molecular pump main body 200 can be integrated with each other.

In addition, also in the amplifier circuit 250 of this embodiment, as shown in FIG. 2, detection of the electromagnetic current iL is performed at the same detection timing Td once in the control cycle Ts. However, in the amplifier circuit 250 of this embodiment, the electromagnetic current iL can be maintained constant. Thus, while the electromagnetic current iL is maintained constant (that is, while the state of the constant mode A3 is maintained), detection of the electromagnetic current iL can be performed (note that in the constant mode A4, it is impossible to perform detection of the current because the electromagnetic currentic iL is not supplied to the current detecting circuit 255).

Accordingly, it is not required to perform detection of the electromagnetic current iL in a transient state. Therefore, even when a deviation is caused between the detection timing Td and a waveform of the electromagnetic current iL, a large error is not caused with respect to the value of the electromagnetic current iL that is intended to be detected. Switching between increase and decrease of the electromagnetic current iL at about the detection timing Td can be avoided, thereby making it possible to reduce noise generated in the amplifier circuit 250 or the power source 153 to reduce a detection error.

Note that in this embodiment, it is described that the switch circuit 280 is composed of the transistor 281 and the diode 285, but this is not obligatory. For example, as shown in FIG. 3, in addition to the structure described above, there may be provided a transistor 282 having a drain terminal 282a and a source terminal 282b connected to the common node C and the negative electrode 153b, respectively. With this structure, a switch signal 277 is outputted from the amplifier control circuit 271 to a gate terminal of the transistor 282 to perform control so that the transistor 282 is turned on when a current flows through a diode 285 in the state of the decreasing mode A2 or the constant mode A3 (that is, control is performed by a synchronous rectification method), thereby making it possible to suppress heat generation of the diode 285 in the above-mentioned mode.

Further, in this embodiment, the increasing time Tp1 and decreasing time, Tp2 are provided such that the time 0.5 Ts is set as the starting point or end point. Alternatively, the increasing time Tp1 and decreasing time Tp2 may be provided such that the time Ts is set as the endpoint or the time 0 is set as the starting point.

Further, this embodiment has described that in the case where the electromagnetic current iL is in a constant state (i.e., in the state of the constant mode A3), the electromagnetic current iL is detected. In a more specific manner, the following may be performed. In other words, control may be performed such that the state of the constant mode A3 is forcefully maintained with respect to the amplifier circuit 250 and switch circuit 280 in the control cycle Ts, thereby detecting the electromagnetic current iL in this period. In this case, the time during which the state of the constant mode A3 is forcefully maintained may be the time during which the electromagnetic current iL can be detected in the current detecting circuit 255. For example, as shown in FIG. 4, the time is set to be a time from the time 0 to the time 0.1 Ts in the control cycle Ts. Then, a detection timing Td is set within a range between the time 0 and the time 0.1 Ts, thereby detecting the electromagnetic current iL. After that, during the remaining time (from the time 0.1 Ts to the time Ts), like in the control described above, for example, during the time from the time 0.1 Ts to the time 0.55 Ts (during the former half of the remaining time), the transistor 281 may be kept turned on, and during the time from the time 0.55 Ts to the time Ts (the latter half of the remaining time), the transistor 281 may be kept turned off to set the time Tp1 and the time Tp2 with the time 0.55 Ts (half the time of the remaining time) being set as the starting point or the endpoint. As a result, the detection of the electromagnetic current iL can be reliably performed in the state of the constant mode A3.

Next, description will be made of a second embodiment of the present invention. The second embodiment is another example of the amplifier circuit 250 and switch circuit 280 of the first embodiment.

FIG. 5 shows a circuit diagram of an amplifier circuit according to the second embodiment of the present invention. Note that components identical with those of FIG. 1 are denoted by the same reference symbols, and descriptions thereof are omitted.

In FIG. 5, in an amplifier circuit 350, one end 151a of each electromagnet coil 151 is connected to the common node C. The other end 151b of the electromagnet coil 151 is connected to a transistor 361 and a diode 365 (note that a node at the other end 151b will be referred to as "node F").

Herein, the transistor 361 is a power MOSFET, and has a drain terminal 361a connected to the positive electrode 153a of the power source 153 and a source terminal 361b connected to the other terminal 151b of the electromagnet coil 151. The diode 365 is one for current regeneration or a flywheel diode, and has a cathode terminal 365a connected to the other terminal 151b of the electromagnet coil 151 and an anode terminal 365b connected to the negative electrode 153b of the power source 153 through the current detecting circuit 255.

Further, the common node C of the amplifier circuit 350 is connected to a switch circuit 380. In the switch circuit 380, the common node C is connected to a transistor 381 and a diode 385.

The transistor 381 is a power MOSFET, and has a drain terminal 381a connected to the common node C and a source terminal 381b connected to the negative electrode 153b of the power source 153 shared by the amplifier circuit 350. The transistor 381 has a gate terminal to which a switch signal 376 is inputted from an amplifier control circuit 371. The diode 385 is one for current regeneration or a flywheel diode, and has a cathode terminal 385a connected to the positive electrode 153a of the power source 153 and an anode terminal 385b connected to the common node C.

With such the structure, when the transistor 361 of the amplifier circuit 350 is turned on and the transistor 381 of the switch circuit 380 is turned on, a current is supplied from the positive electrode 153a to the negative electrode 153b through the transistor 361, the electromagnet coil 151, the common node C, and the transistor 381. Therefore, the current is supplied to the electromagnet coil 151 from the positive electrode 153a of the power source 153, which increases the electromagnetic current iL (this state will be referred to as "increasing mode B1")

On the other hand, when the transistor 361 of the amplifier circuit 350 is turned off and the transistor 381 of the switch circuit 380 is turned off, due to the counter electromotive force generated by the electromagnetic coil 151, a regenerated current is made to flow from the negative electrode 153b to the positive electrode 153a through (the current detecting circuit 255 and) the diode 365, the electromagnet coil 151, the common node C, and the diode 385. As a result, electromagnetic energy generated from the electromagnet coil 151 is consumed, which decreases the electromagnetic current iL (this state will be referred to as "decreasing mode B2").

Further, when the transistor 361 of the amplifier circuit 350 is turned off and the transistor 381 of the switch circuit 380 is turned on, due to the counter electromotive force generated by the electromagnetic coil 151, a flywheel current is made to flow from the negative electrode 153b to the negative electrode 153b through (the current detecting circuit 255 and) the diode 365, the electromagnet coil 151, the common node C, and the transistor 381. At this time, no electric potential difference is generated between the ends 151a and 151b of the electromagnet coil 151, so the electromagnetic current iL is kept substantially constant (this state will be referred to as "constant mode B3").

Further, in the case other than the constant mode B3, when the transistor 361 of the amplifier circuit 350 is turned on and the transistor 381 of the switch circuit 380 is turned off, due to the counter electromotive force generated by the electromagnetic coil 151, a flywheel current is made to flow from the positive electrode 153a to the, positive electrode 153a through the transistor 361, the electromagnet coil 151, the common node C, and the diode 385. Therefore, also in this case, the electromagnetic current iL is kept substantially constant (this state will be referred to as "constant mode B4").

Herein, FIG. 6 is a time chart showing how adjustment is made between control phases of the amplifier circuit 350 with respect to the transistor 361 etc. and switch phases of the switch circuit 380 with respect to the transistor 381 etc.

In FIG. 6, also in this embodiment, control is performed with respect to the switch circuit 380 such that the time during which the transistor 381 is kept turned on and the time during which the transistor 381 is kept turned off are made to be the same within the control cycle Ts. Herein, during the time from the time 0 to the time 0.5 Ts, the transistor 381 is kept turned on and the voltage of the common node C is changed to the voltage VL substantially the same as that of the negative electrode 153b. During the time from the time 0.5 Ts to the time Ts, due to the counter electromotive force or the like generated by the electromagnetic coils 151, the voltage of the common node C is changed to the voltage VH substantially the same as that of the positive electrode 153a. The transition of the common node C is the same as that of the first embodiment (FIG. 2).

In the case where the value of the electromagnetic current iL detected by the current detecting circuit 255 is smaller than the current command value, control is performed such that the electromagnetic current iL is increased in the amplifier control circuit 371. In this case, control is performed such that the state of the increasing mode B1 is maintained for the increasing time Tp1 in one control cycle Ts. In other times, control is performed such that the state of the constant mode B3 or B4 is maintained. To be specific, during the time from the time 0 to the time 0.5 Ts, the transistor 381 of the switch circuit 380 is kept turned on, so until the time 0.5 Ts as an endpoint, the transistor 361 is turned on for the time Tp1, thereby maintaining the state of the increasing mode B1 only for the increasing time Tp1. Until the transistor 361 is turned on, the transistor 361 is kept turned off to thereby maintain the state of the constant mode B3. On the other hand, during the time from the time 0.5 Ts to the time Ts, the transistor 381 of the switch circuit 380 is kept turned off, so the transistor 361 is turned on, thereby maintaining the state of the constant mode B4. As a result, in one control cycle Ts, the electromagnetic current iL is increased only during the increasing time Tp1.

On the other hand, in the case where the value of the electromagnetic current iL detected by the current detecting circuit 255 is larger than the current command value, control is performed such that the electromagnetic current iL is decreased in the amplifier control circuit 371. In this case, control is performed such that the state of the decreasing mode B2 is maintained for the decreasing time Tp2 in one control cycle Ts. In other times, control is performed such that the state of the constant mode B3 or B4 is maintained. To be specific, during the time from the time 0.5 Ts to the time Ts, the transistor 381 of the switch circuit 380 is kept turned off, so with the time 0.5 Ts as a starting point, the transistor 361 is kept turned off for the time Tp2, thereby maintaining the state of the decreasing mode B2 only for the decreasing time Tp2. After the time Tp2 has elapsed, the transistor 361 is turned on, thereby maintaining the state of the constant mode B4. On the other hand, during the time from the time 0 to the time 0.5 Ts, the transistor 381 of the switch circuit 380 is kept turned on, so the transistor 361 is turned off, thereby setting the state of the constant mode B3. As a result, in one control cycle Ts, the electromagnetic current iL is decreased only during the decreasing time Tp2.

Further, in the case where the value of the electromagnetic current iL detected by the current detecting circuit 255 coincides with the current command value, control is performed such that the electromagnetic current iL is kept constant in the amplifier control circuit 371. In this case, control is performed such that the state of the constant mode B3 or B4 is always maintained in one control cycle Ts. To be specific, during the time from the time 0 to the time 0.5 Ts, the transistor 381 of the switch circuit 380 is kept turned on, so the transistor 361 is turned off, thereby setting the state of the constant mode B3. On the other hand, during the time from the time 0.5 Ts to the time Ts, the transistor 381 of the switch circuit 380 is kept turned off, so the transistor 361 is turned on, thereby setting the state of the constant mode B4. As a result, the electromagnetic current iL is kept constant.

As described above, an increasing, decreasing, or constant state of the electromagnetic current iL can thus be maintained also in the amplifier circuit 350 and the switch circuit 380 which are different from those of the first embodiment (FIG. 1). The amplifier circuit 350 is also composed of one transistor 361 and one diode 365. Therefore, the elements of the amplifier circuit 350 can be reduced in number, thereby making it possible to reduce the costs of manufacture, installation, or the like of the turbo molecular pump. Accordingly, the amplifier circuits 250 and 350 that are easy to design can be chosen and a structure that is easy to control can be chosen in controlling the amplifier circuits 250 and 350.

In addition, the amplifier circuit 350 of this embodiment can keep the electromagnetic current iL constant as in the case of the first embodiment. Therefore, when the electromagnetic current iL is kept constant (that is, in a state of the constant mode B3), it is possible to perform detection of the electromagnetic current iL. Accordingly, it is not required to perform detection of the electromagnetic current iL in a transient state, so an error in detection of the electromagnetic current iL can be reduced.

Note that in this embodiment, it is described that the switch circuit 380 is composed of the transistor 381 and the diode 385, but this is not obligatory. As shown in FIG. 7, there may be provided a transistor 382 having a drain terminal 382a and a source terminal 382b connected to the positive electrode 153a and the common node C, respectively. As a result, a switch signal 377 is outputted to a gate terminal of the transistor 382 to perform control by the synchronous rectification method, thereby making it possible to suppress heat generation of a diode 385 in the decreasing mode B2 or the constant mode B4.

Further, also in this embodiment, it is described that when the electromagnetic current iL is constant, detection of the electromagnetic current iL is performed. However, as in the case described in the first embodiment (FIG. 4), it is also possible to perform control for forcefully making a state of the constant mode B3 in the control cycle Ts with respect to the amplifier circuit 350 and the switch circuit 380 to perform detection of the electromagnetic current iL within this period. As a result, the electromagnetic current iL can be reliably detected in the state of the constant mode B3.

Next, a third embodiment of the present invention will be described. In the first and second embodiments, the electromagnet coils 151, 151, . . . which respectively constitute the electromagnets 104, 105, 106A, and 106B are controlled by one of the amplifier circuits 250 and 350. In the third embodiment, the electromagnet coils 151, 151, . . . are appropriately divided into two groups according to arrangements of the electromagnets 104, 105, 106A, and 106B. The groups are respectively controlled by the amplifier circuit 250 (FIG. 1) having the same structure as that of the first embodiment and the amplifier circuit 350 (FIG. 5) having the same structure as that of the second embodiment.

A circuit diagram of an amplifier circuit according to the third embodiment of the present invention is shown in FIG. 8. Note that the same elements as those of FIGS. 1 and 5 are denoted by the same reference symbols and the descriptions of those are omitted.

In FIG. 8, connected to the plurality of electromagnet coils 151, 151, . . . which respectively constitute the electromagnets 104, 105, 106A, and 106B is a combination of the amplifier circuit 250 (FIG. 1) having the same structure as that of the first embodiment and the amplifier circuit 350 (FIG. 5) having the same structure as that of the second embodiment. The plurality of electromagnet coils 151, 151, . . . are divided into two groups (one including the electromagnet coils 151, 151, . . . which are controlled by the amplifier circuit 250 is referred to as "group A" and one including the electromagnet coils 151, 151, . . . which are controlled by the amplifier circuit 350 is referred to as "group B").

Herein, how the grouping is performed is described while taking specific examples. As an example, description is made of the X-axis positive side electromagnet 104X+ and the X-axis negative side electromagnet 104X− of the upper radial electromagnets 104, and the X-axis positive side electromagnet 105X+ and the X-axis negative side electromagnet 105X+ of the lower radial electromagnets 105.

For example, when a position of the rotor 103 as a whole is controlled in a + direction of the X axis, the electromagnetic current iL flowing through the electromagnets 104X+ and 105X+ is increased and the electromagnetic current iL flowing through the electromagnets 104X+ and 105X+ is decreased. On the other hand, when the position of the rotor 103 as a whole is controlled in a—direction of the X axis, the electromagnetic current iL flowing through the electromagnets 104X+ and 105X+ is decreased and the electromagnetic current iL flowing through the electromagnets 104X− and 105X− is increased. As described above, in many cases, controls with respect to the upper radial electromagnets 104 and the lower radial electromagnets 105 in the X-axis directions are the same.

Accordingly, when, for example, the electromagnet 104X+ is put into the group A, the electromagnet 105X+ is put into the group B, whereby at the time of increase of the electromagnetic current iL, when a current flows from the common node C to the negative electrode 153b in the group A, a current flows from the positive electrode 153a to the common node C in the group B. Therefore, the electromagnetic currents iL flowing through the common node C are equalized. The same holds true for the case where the electromagnetic current iL is decreased or the electromagnetic current iL is constant. Further, the same holds true for the case where the electromagnet 104X+ is put into the group B and the electromagnet 105X+ is put into the group A.

Thus, among the upper radial electromagnet 104 and the lower radial electromagnet 105, the electromagnet 104X+ and the electromagnet 105X+ are divided into different groups. Further, the same holds true for the other electromagnets 104X− and the electromagnet 105X−, the electromagnet 104Y+ and the electromagnet 105Y+, and the electromagnet 104Y− and the electromagnet 105Y− on the Y-axis side, so they are respectively divided into different groups.

On the other hand, with regard to a relationship between the X-axis positive side electromagnet 104X+ and the X-axis negative side electromagnet 104X−, when the position of the rotor 103 is controlled in the X-axis positive direction, there is a tendency that the electromagnetic current iL of the electromagnet 104X+ is increased and the electromagnetic current iL of the electromagnet 104X− is decreased. Therefore, by putting those electromagnets into the same group, the electromagnetic currents iL flowing through the common node C are easy to be equalized. Thus, among the upper radial electromagnets 104 and the lower radial electromagnets 105, the electromagnet 104X+ and the electromagnet 104− are put into the same group. Further, the same holds true for the other electromagnet 104Y+ and the electromagnet 104Y−, the electromagnet 105X+ and the electromagnet 105X−, the electromagnet 105Y+ and the electromagnet 105Y− of the lower radial electromagnets 105, and the axial electromagnet 106A and the axial electromagnet 106B, so they are respectively put into the same group.

The ends 151a, 151a, . . . of the electromagnet coils 151, 151, . . . respectively divided into the groups A and B as described above are all connected to the common node C. Further, a switch circuit 480 is connected to the common node C.

In the switch circuit 480, connected to the common node C, is a combination of the transistor 281 and the diode 285 having the same structure as that of the switch circuit 280 of the first embodiment, and the transistor 381 and the diode 385 having the same structure as that of the switch circuit 380 of the second embodiment. Further, the switch signal 276 and the switch signal 376 are respectively outputted to the gate terminals of the transistors 281 and 381 from an amplifier control circuit 471. The amplifier control circuit 471 has both functions of the amplifier control circuit 271 of the first embodiment and the amplifier control circuit 371 of the second embodiment.

According to the above-mentioned structure, FIG. 9 is a time chart showing how adjustment is made on switch phases by the switch circuit 480 with respect to the transistors 281, 381, etc.

In FIG. 9, with respect to the switch circuit 480, control is performed such that a time during which the transistor 381 is kept turned on and a time during which the transistor 281 is kept turned on are made to be the same within the control cycle Ts. Herein, during the time from the time 0 to the time 0.5 Ts, the transistor 281 is kept turned off and the transistor 381 is kept turned on, and from the time 0.5 Ts to a time Ts, the transistor 281 is kept turned on and the transistor 381 is kept turned off. In this case, in order to prevent generation of noise or the like due to a flow of a through current between the positive electrode 153$a$ and the negative electrode 153$b$, in each of an interval after the transistor 381 is turned off and before the transistor 281 is turned on (around the time 0.5 Ts) and an interval after the transistor 281 is turned off and before the transistor 381 is turned on (around the time 0 and time Ts), it is desirable to provide a dead time in which the both transistors 281 and 381 are turned off (not shown).

Due to such the control with respect to the switch circuit 480, the common node C makes a transition from the voltage VL in the time 0 to the time 0.5 Ts to the voltage VH in the time 0.5 Ts to the time Ts. Accordingly, the transition of the common node C is the same as that of the first embodiment (FIG. 2) and that of the second embodiment (FIG. 6). Thus, with respect to the amplifier circuit 250, by performing the same control as that described in the first embodiment, the electromagnetic current iL can be increased, decreased, or kept constant. Further, also with respect to the amplifier circuit 350, by performing the same control as that described in the second embodiment, the electromagnetic current iL can be increased, decreased, or kept constant. As a result, each amplifier circuit 250, 350 is composed of one transistor 261, 361 and one diode 265, 365, respectively. Therefore, it is possible to reduce the elements of the amplifier circuit 250, 350 in number and reduce the costs required for the manufacture, installation, or the like of the turbo molecular pump.

Further, also during detection of the electromagnetic current iL, the electromagnetic current iL can be kept constant, so when each amplifier circuit 250, 350 is in the constant modes A3 and B3, the detection of the electromagnetic current iL can be performed. Accordingly, in both the amplifier circuits 250 and 350, it is not required to perform detection of the electromagnetic current iL in a transient state, so an error in detection of the electromagnetic current iL can be decreased. In particular, the amplifier circuits 250 and 350 become the constant modes A3 and B3, respectively, immediately after the time 0 in the control cycle Ts. Therefore, the detection of the electromagnetic current iL can be performed at a common detection timing Td, thereby making it possible to easily perform control of the detection timing Td.

Further, by effecting the appropriate grouping to the electromagnet coils 151, 151, ... which respectively constitute electromagnets 104, 105, 106A, and 106B, the electromagnetic currents iL flowing through the common node C can be equalized. Therefore, the transistors 281 and 381 and the diodes 285 and 385 can be reduced in size, thereby making it possible to further miniaturize the turbo molecular pump. Further, it is also possible to decrease the current flowing through those elements, so heat generation or the like can be prevented. Still further, it is also possible to decrease the current required to be supplied from the power source 153, so an input power supply capacity can be reduced.

Note that in this embodiment, it is described that when the electromagnetic current iL is in a constant state, the detection of the electromagnetic current iL is performed. However, as in the case described in the first embodiment (FIG. 4), it is also possible to perform control for forcefully making a state of the constant mode A3, B3 in the control cycle Ts with respect to the amplifier circuits 250, 350 and the switch circuit 480 to perform detection of the electromagnetic current iL within this period.

BRIEF DESCRIPTION OF THE DRAWINGS

[FIG. 12] A time chart showing how control is made on the conventional amplifier circuit.

Description of Symbols

Figure 1:
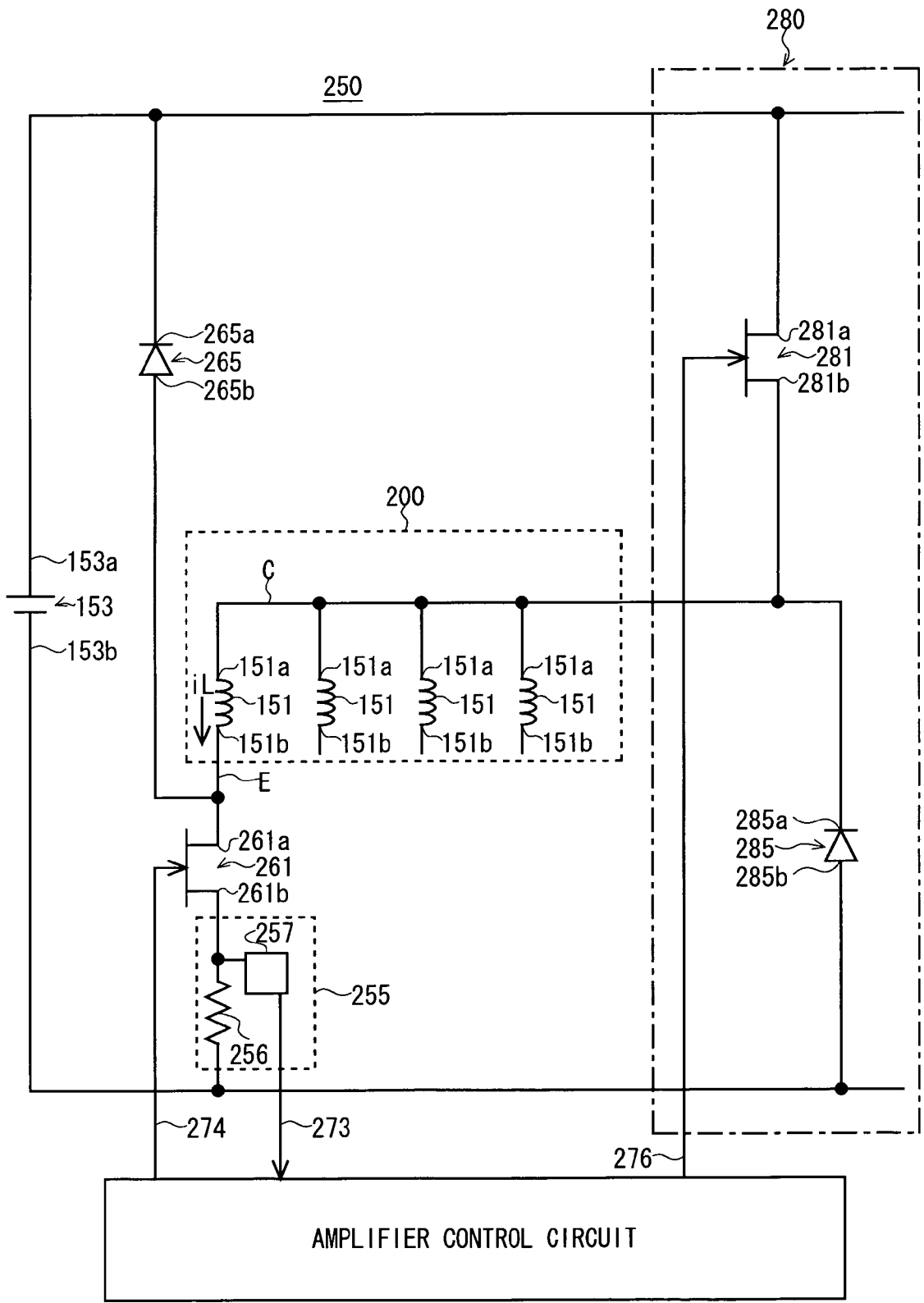
[FIG. 1] A circuit diagram of an amplifier circuit according to a first embodiment of the present invention.
Figure 2:
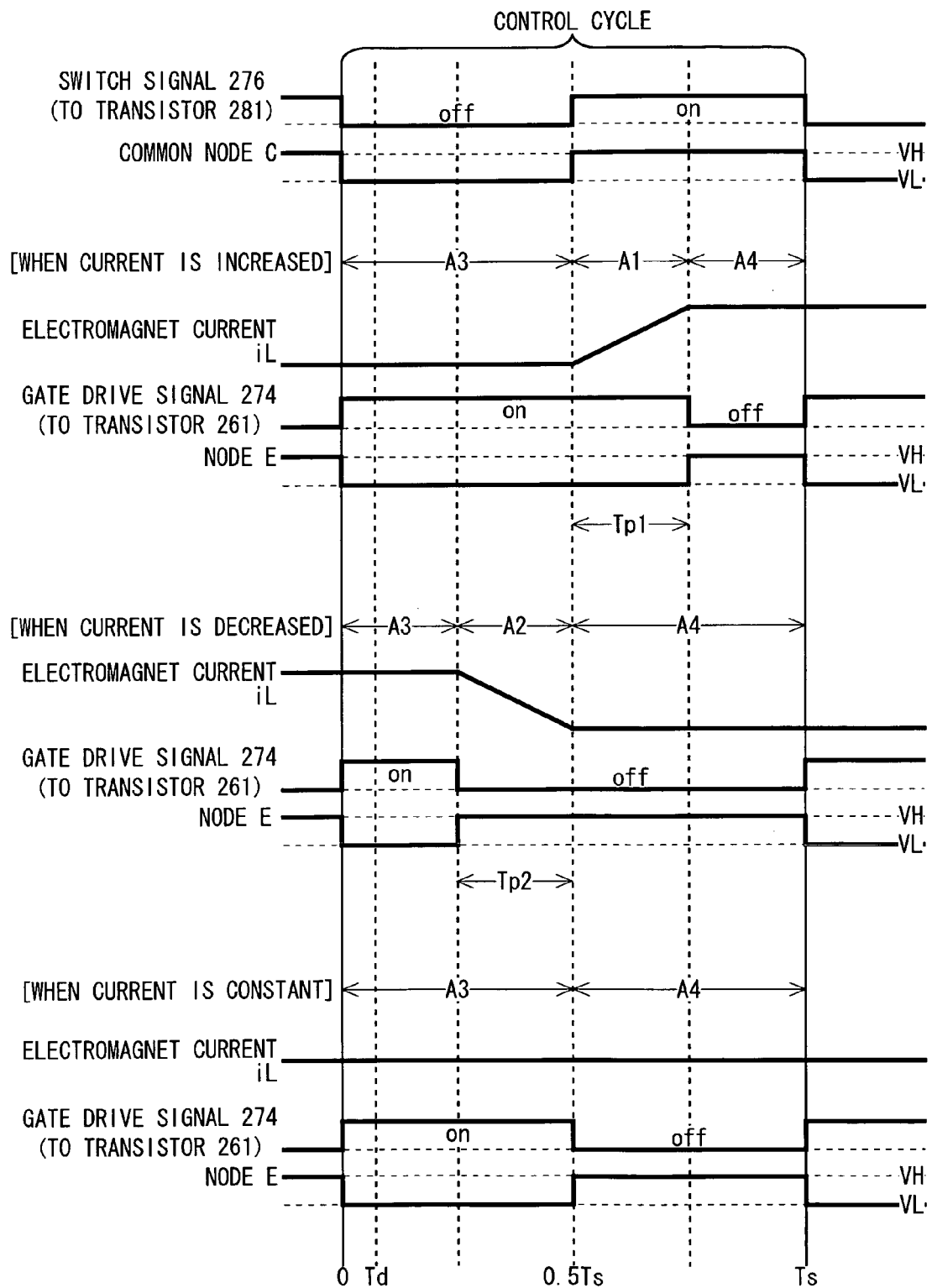
[FIG. 2] A time chart showing how adjustment is made between control phases of the amplifier circuit and switch phases of a switch circuit, according to the first embodiment of the present invention.
Figure 3:
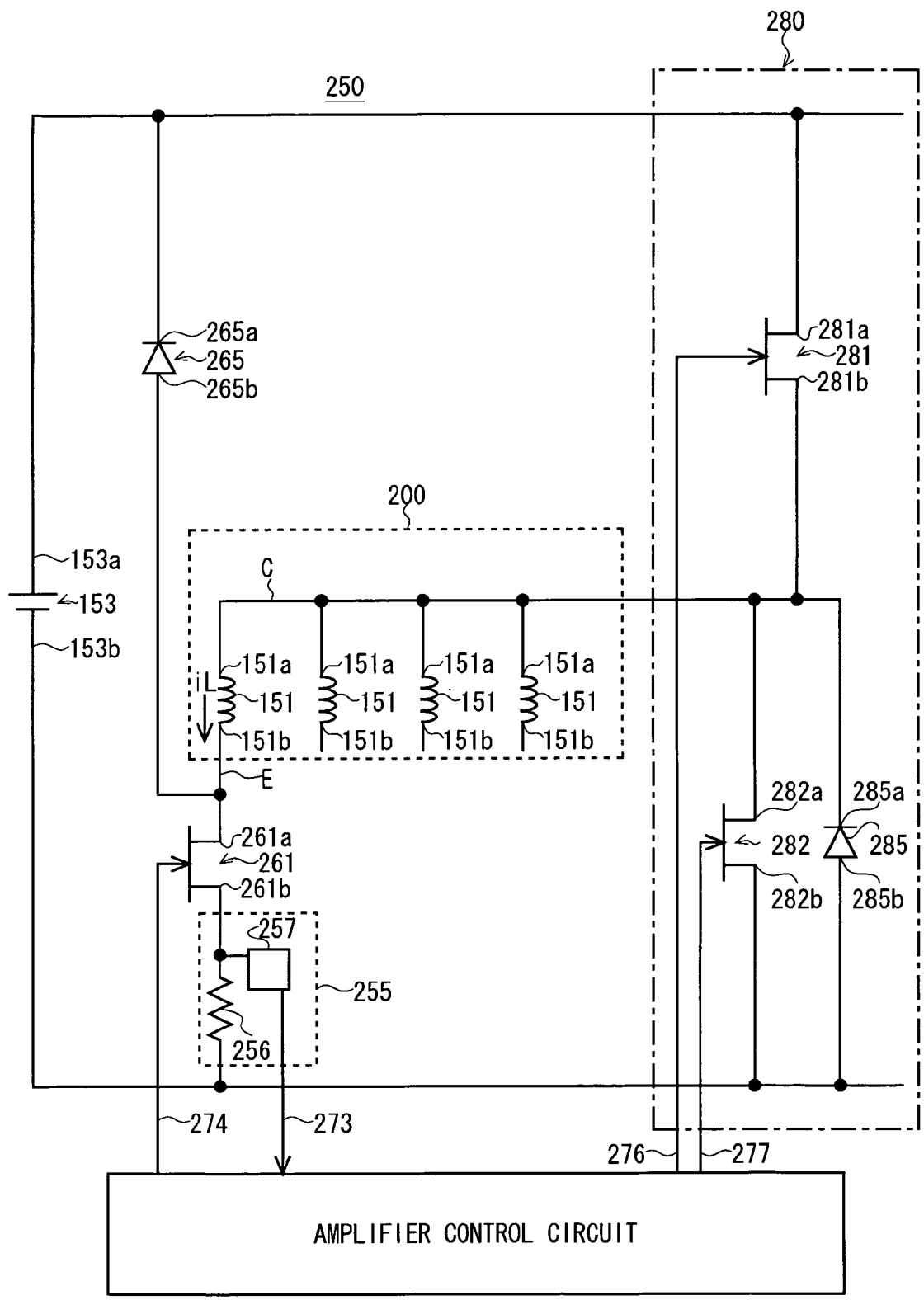
[FIG. 3] Another example of FIG. 1.
Figure 4:
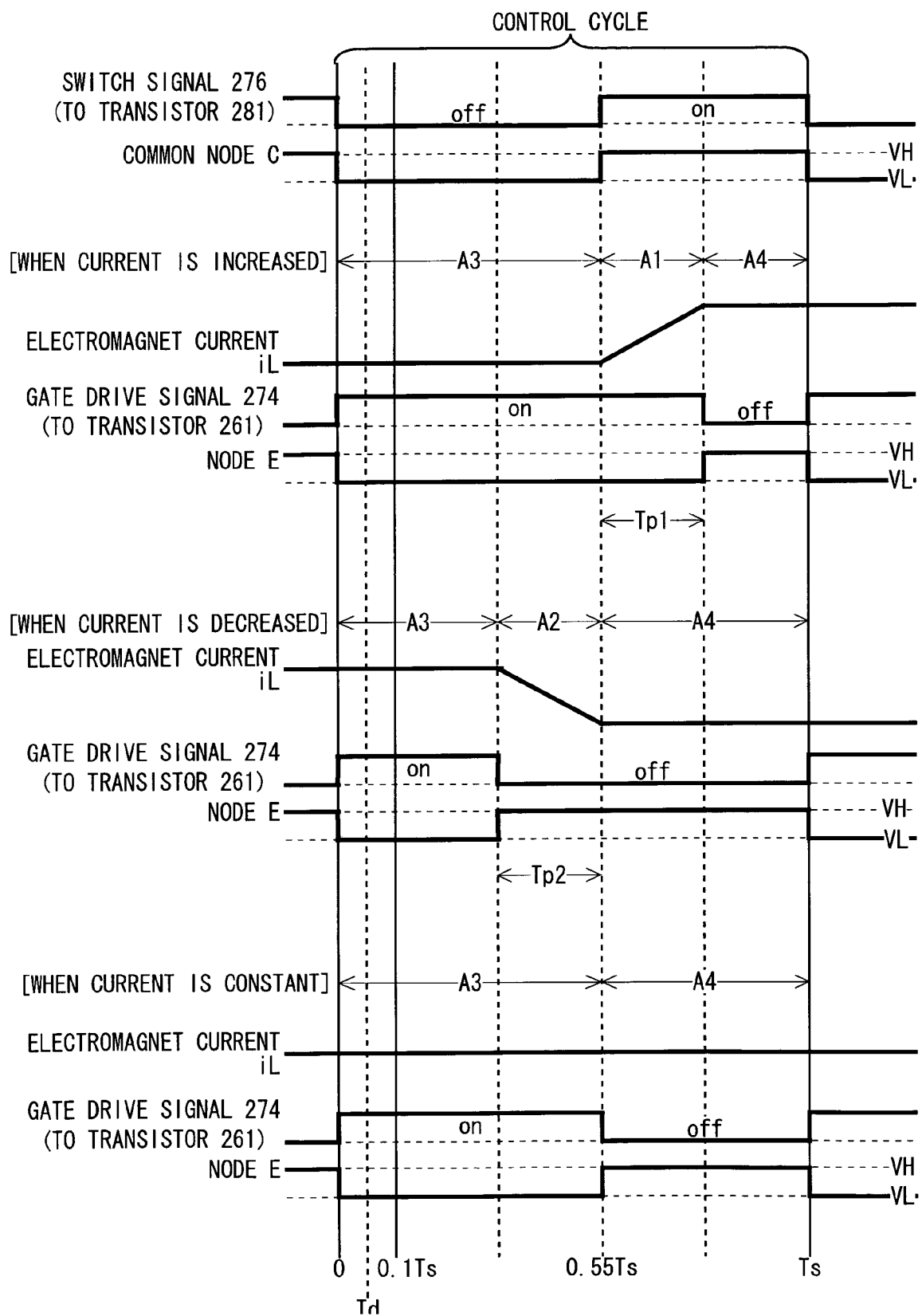
[FIG. 4] Another example of FIG. 2.
Figure 5:
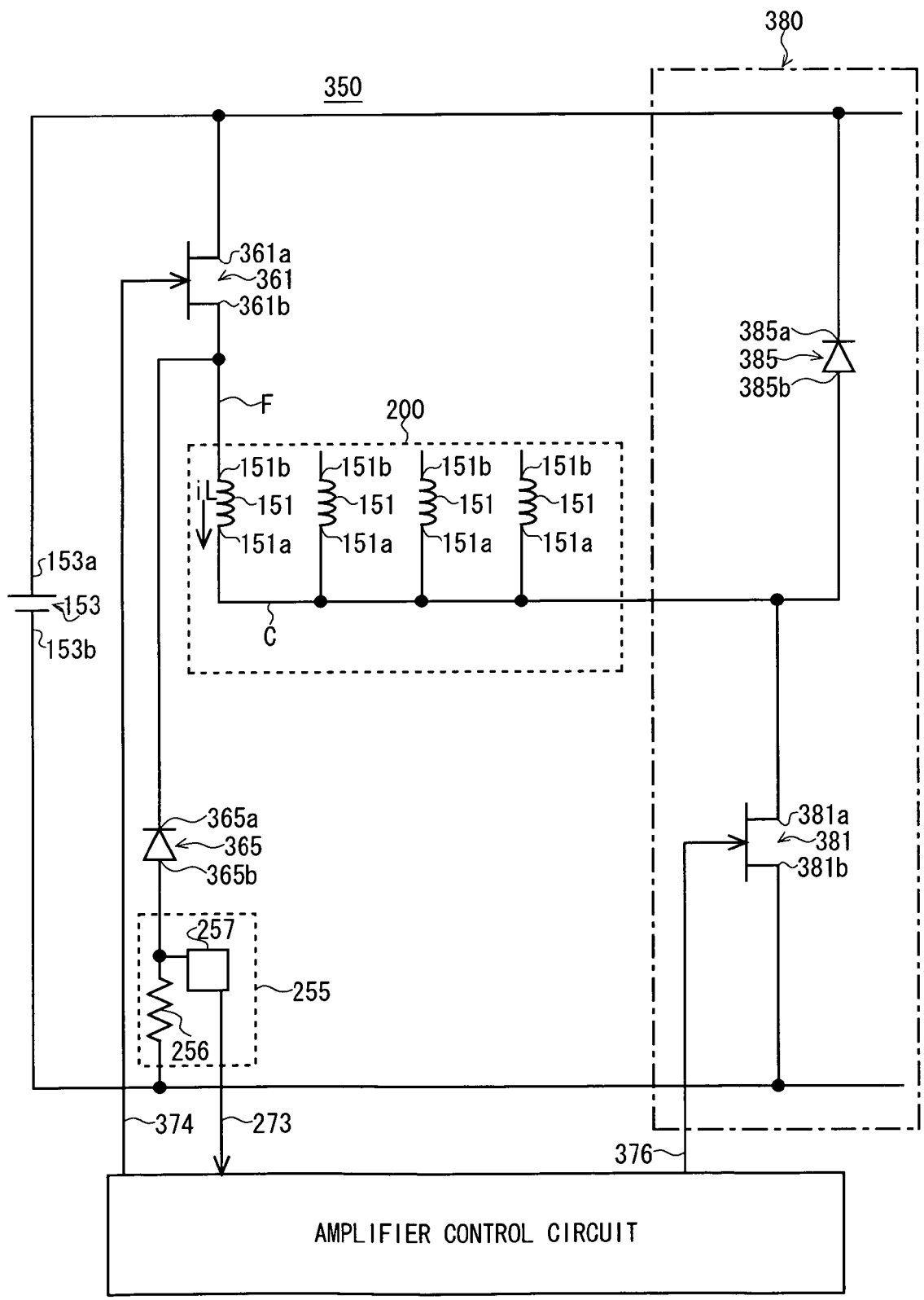
[FIG. 5] A circuit diagram of an amplifier circuit according to a second embodiment of the present invention.
Figure 6:
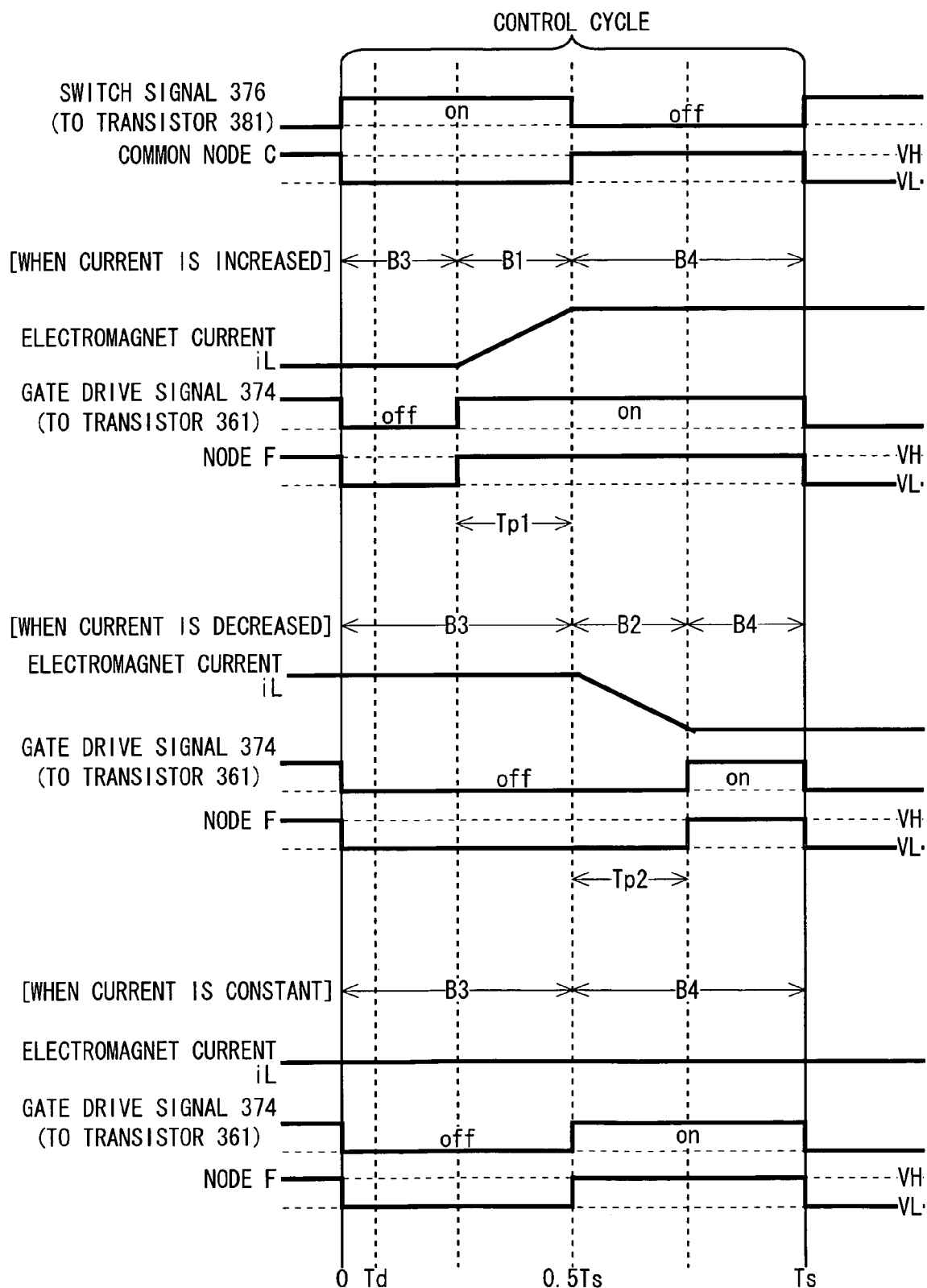
[FIG. 6] A time chart showing how adjustment is made between control phases of the amplifier circuit and switch phases of a switch circuit, according to the second embodiment of the present invention.
Figure 7:
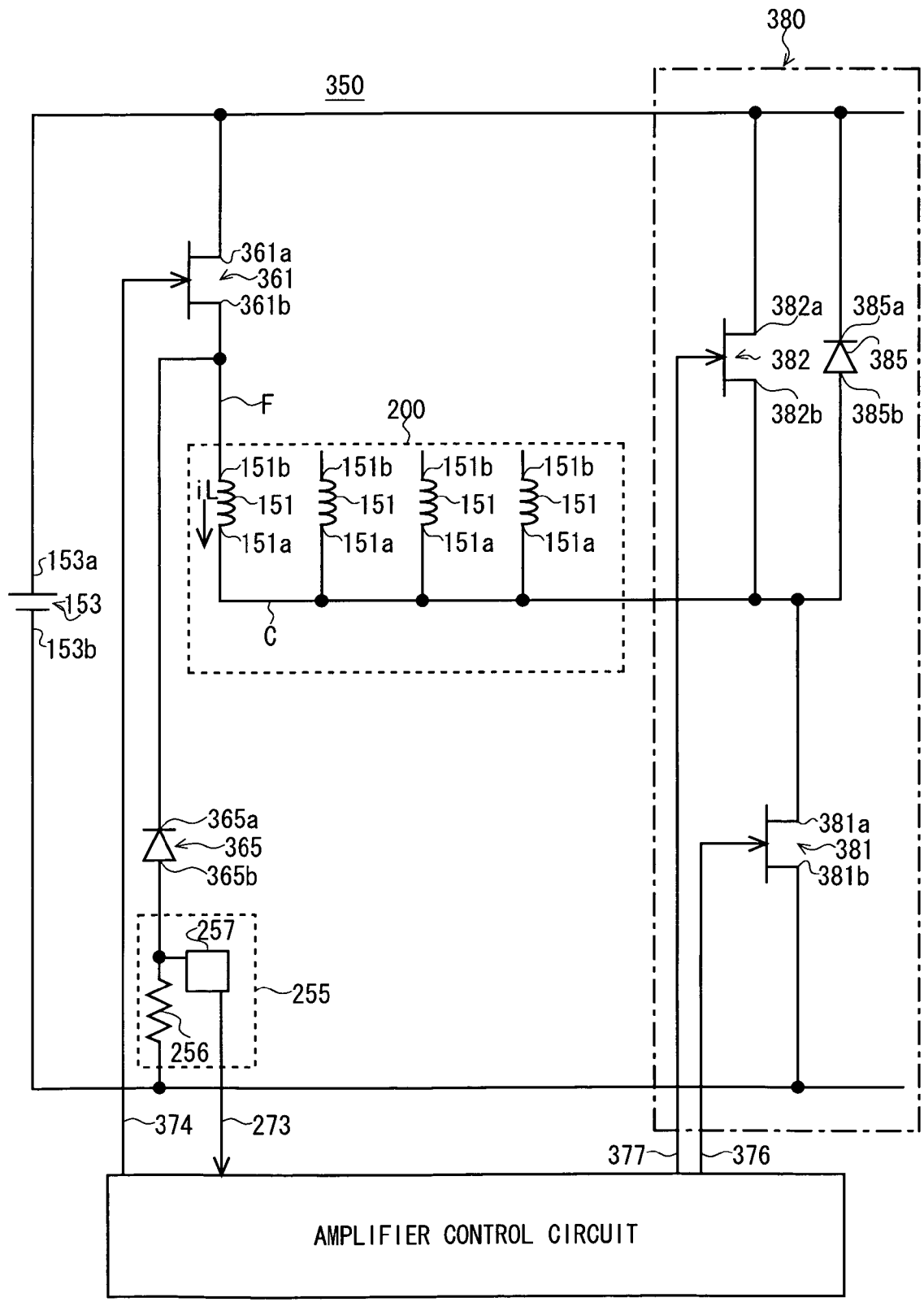
[FIG. 7] Another example of FIG. 5.
Figure 8:
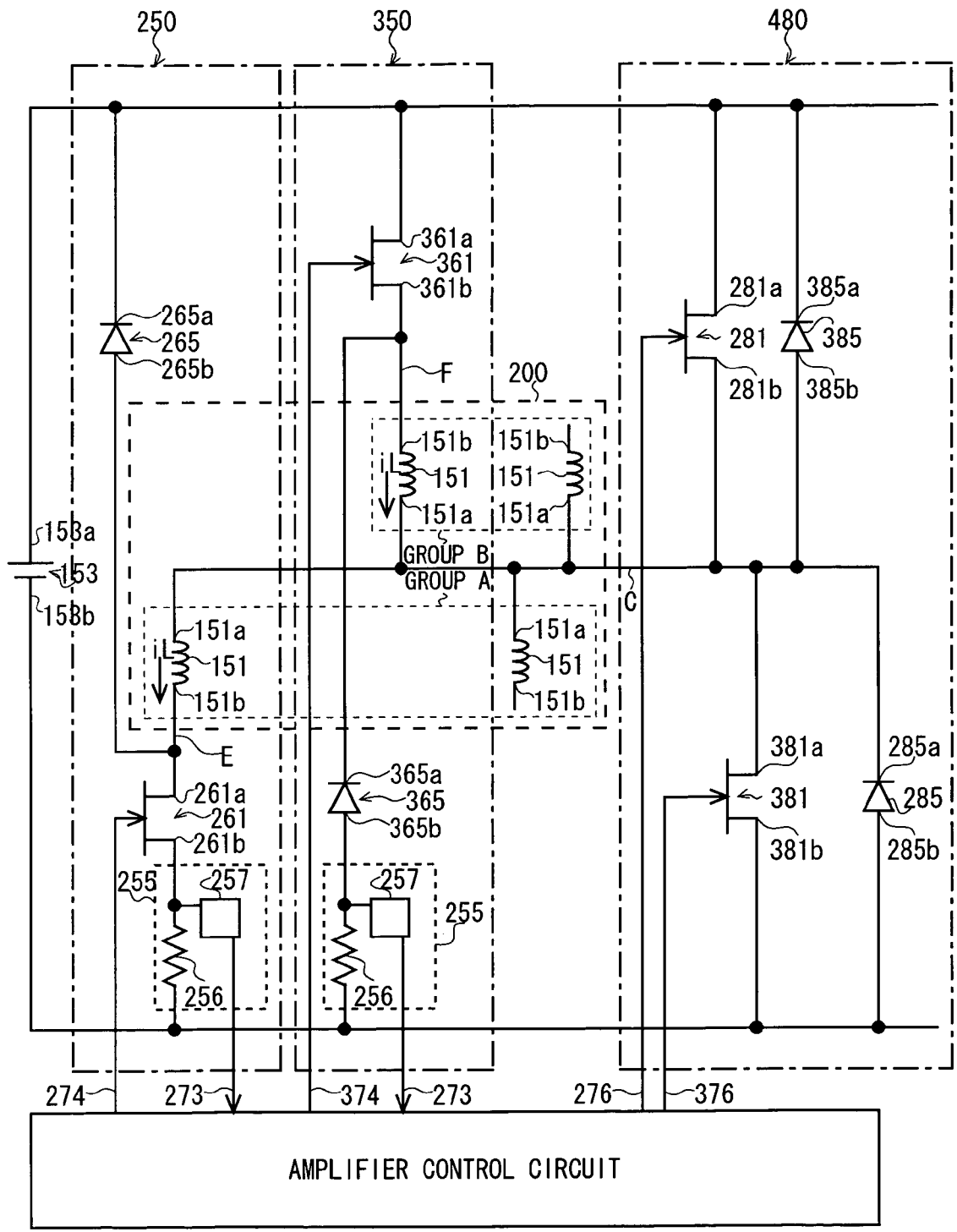
[FIG. 8] A circuit diagram of an amplifier circuit according to a third embodiment of the present invention.
Figure 9:
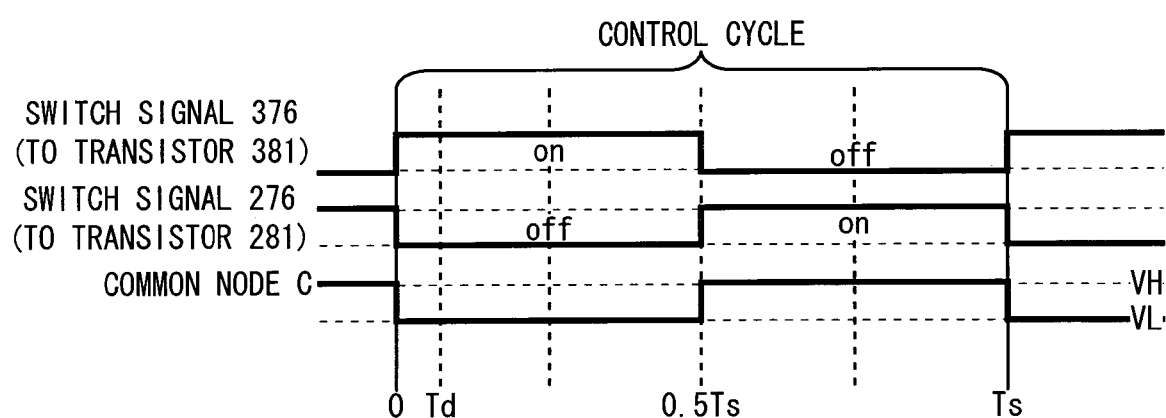
[FIG. 9] A time chart showing how adjustment is made on switch phases of as witch circuit, according to the third embodiment of the present invention.
Figure 10:
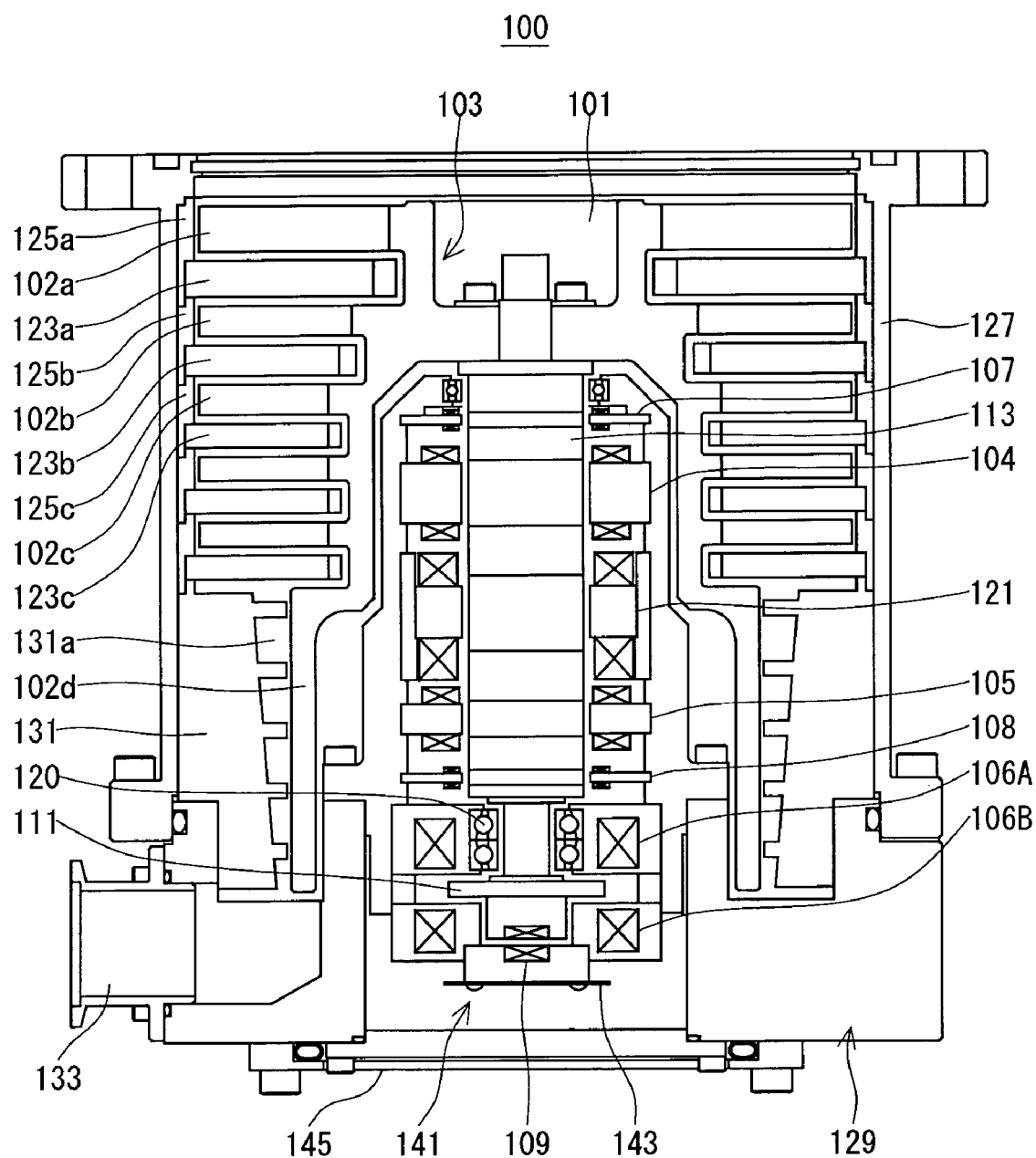
[FIG. 10] A vertical sectional view of a turbo molecular pump main body.
Figure 11:
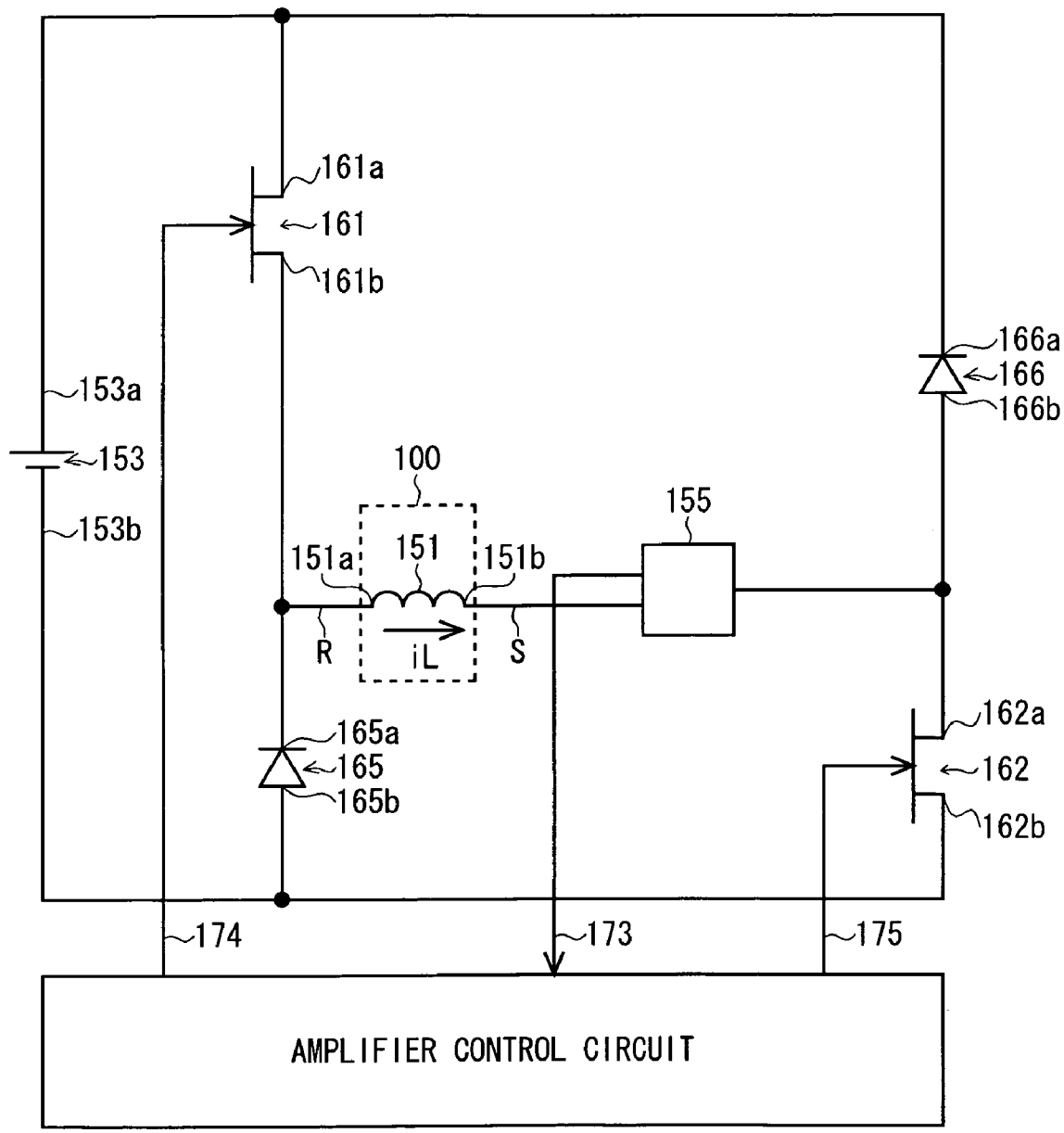
[FIG. 11] A circuit diagram of a conventional amplifier circuit.

100, 200 turbo molecular pump main body
102 rotary vanes
103 rotor
104, 105, 106A, and 106B electromagnet
113 rotor shaft
150, 250, 350 amplifier circuit
151 electromagnet coil
153 power source
155, 255 current detecting circuit
161, 162, 261, 281, 282, 361, 381, 382 transistor
165, 166, 265, 285, 365, 385 diode
171, 271, 371, 471 amplifier control circuit
280, 380, 480 switch circuit

The invention claimed is:

1. A magnetic bearing device, comprising:
a rotor;
three or more electromagnets for controlling a radial position and/or an axial position of the rotor;
a power source for supplying power to the electromagnets;
a common node commonly connected to each one end of the electromagnets;
switch means for switching a voltage of the common node; and
excitation control means for controlling excitation of each of the electromagnets by a supply current that is supplied from the other end of one of the electromagnets to a negative electrode of the power source and that flows through the electromagnets in one direction, or by a regenerated current that is regenerated from the other end of one of the electromagnets to a positive electrode of the power source and that flows through the electromagnets in one direction;

wherein the switch means includes:
a first switch element for connecting and disconnecting between the positive electrode and the common node; and
a first rectifier element for causing a current to flow from the negative electrode to the common node; and
wherein the excitation control means includes:
a second switch element for connecting and disconnecting between the other end of one of the electromagnets and the negative electrode without being connected in parallel with a rectifier element; and
a second rectifier element for causing a current to flow from the other end of one of the electromagnets to the positive electrode without being connected in parallel with a switch element.

2. The magnetic bearing device according to claim 1, wherein the current caused to flow through each of the electromagnets is increased, decreased, or maintained to be constant by adjusting a switching phase of the switch means and a control phase of the excitation control means within a common control cycle.

3. The magnetic bearing device according to claim 1, wherein the first rectifier element includes a third switch element connected in parallel therewith.

4. The magnetic bearing device according to claim 1, further comprising current detecting means for detecting a value of the current when a constant current is caused to flow through the electromagnets.

5. The magnetic bearing device according to claim 4, wherein the current detecting means includes a resistance having one end connected to the negative electrode, and a detection portion for detecting a current flowing through the resistance.

6. A turbo molecular pump comprising the magnetic bearing device according to claim 1 mounted thereto, wherein the rotor has rotary vanes and a rotor shaft placed at the center of the rotary vanes; and each of the electromagnets levitates the rotor shaft by a magnetic force.

7. The magnetic bearing device according to claim 1, wherein the second switch element and the second rectifier element are formed of a single switch element and a single rectifier element, respectively.

8. The magnetic bearing device according to claim 1, wherein the second switch element is not connected in parallel with a rectifier element through which flywheel current flows.

9. A magnetic bearing device, comprising:
a rotor;
three or more electromagnets that control a radial position and/or an axial position of the rotor;
a power source that supplies power to the electromagnets;
a common node commonly connected to each one end of the electromagnets;
a switching circuit that switches a voltage of the common node, the switching circuit including a first switch element for connecting and disconnecting between one end of the power source and the common node, and a first rectifier element connected between the other end of the power source and the common node; and
an excitation control circuit that controls excitation of each of the electromagnets by a supply current that flows through the electromagnets in one direction or a regenerated current that flows through the electromagnets in one direction, the excitation control circuit including a second switch element that connects and disconnects between the other end of one of the electromagnets and the other end of the power source without being connected in parallel with a rectifier element, and a second rectifier element connected between the other end of one of the electromagnets and the one end of the power source without being connected in parallel with a switch element.

10. The magnetic bearing device according to claim 9, wherein the second switch element and the second rectifier element are formed of a single switch element and a single rectifier element, respectively.

11. The magnetic bearing device according to claim 9, wherein the current caused to flow through each of the electromagnets is increased, decreased, or maintained to be constant by adjusting a switching phase of the switching circuit and a control phase of the excitation control circuit within a common control cycle.

12. The magnetic bearing device according to claim 9, wherein the first rectifier element includes a third switch element connected in parallel therewith.

13. The magnetic bearing device according to claim 9, further comprising a current detecting circuit that detects a value of the current when a constant current is caused to flow through the electromagnets.

14. The magnetic bearing device according to claim 13, wherein the current detecting circuit includes a resistance and a detection portion for detecting a current flowing through the resistance.

15. A turbo molecular pump comprising the magnetic bearing device according to claim 9 mounted thereto, wherein the rotor has rotary vanes and a rotor shaft placed at the center of the rotary vanes; and each of the electromagnets levitates the rotor shaft by a magnetic force.

16. A turbo molecular pump comprising the magnetic bearing device according to claim 9 mounted thereto.

17. The magnetic bearing device according to claim 9, wherein the second switch element is not connected in parallel with a rectifier element through which flywheel current flows.

* * * * *